United States Patent [19]

Elgamal et al.

[11] Patent Number: 5,410,671
[45] Date of Patent: Apr. 25, 1995

[54] DATA COMPRESSION/DECOMPRESSION PROCESSOR

[75] Inventors: Taher A. Elgamal, Palo Alto; Daniel D. Claxton, Sausalito; Robert F. Honea, Santa Clara, all of Calif.

[73] Assignee: Cyrix Corporation, Richardson, Tex.

[21] Appl. No.: 66,317

[22] Filed: May 21, 1993

Related U.S. Application Data

[63] Continuation of Ser. No. 951,033, Sep. 24, 1992, abandoned, which is a continuation of Ser. No. 568,363, Aug. 16, 1990, abandoned, which is a continuation-in-part of Ser. No. 517,630, May 1, 1990, abandoned.

[51] Int. Cl.[6] .............................................. G06F 12/02
[52] U.S. Cl. ..................................... 395/425; 395/400
[58] Field of Search ................................ 395/425, 400

[56] References Cited

U.S. PATENT DOCUMENTS

| | | | |
|---|---|---|---|
| 4,558,302 | 12/1985 | Welch | 340/347 |
| 4,654,777 | 3/1987 | Nakamura | 395/400 |
| 4,667,325 | 5/1987 | Kitano et al. | 371/25 |
| 4,680,700 | 7/1987 | Hester et al. | 395/400 |
| 4,701,745 | 10/1987 | Waterworth | 341/95 X |
| 4,800,489 | 1/1989 | Moyer et al. | 395/400 |
| 4,814,746 | 3/1989 | Miller et al. | 341/95 |
| 4,843,389 | 6/1989 | Lisle et al. | 341/106 |
| 4,847,619 | 7/1989 | Kato et al. | 341/106 |
| 4,870,415 | 9/1989 | Van Maren et al. | 341/94 |
| 4,876,541 | 10/1989 | Storer | 341/106 X |
| 4,881,075 | 11/1989 | Weng | 341/87 |
| 4,899,147 | 2/1990 | Schiavo et al. | 341/51 X |
| 4,906,991 | 3/1990 | Fiala et al. | 341/51 |
| 4,929,946 | 5/1990 | O'Brien et al. | 341/87 |
| 4,942,541 | 7/1990 | Hoel et al. | 395/115 |
| 4,989,137 | 1/1991 | Oxley et al. | 395/425 |
| 5,077,654 | 12/1991 | Ohtsuki | 395/800 |

*Primary Examiner*—Jack B. Harvey
*Assistant Examiner*—Michael H. Tall
*Attorney, Agent, or Firm*—Andrew S. Viger; John L. Maxin

[57] ABSTRACT

A data compression/decompression processor (a single-chip VLSI data compression/decompression engine) for use in applications including but not limited to data storage and communications. The processor is highly versatile such that it can be used on a host bus or housed in host adapters, so that all devices such as magnetic disks, tape drives, optical drives and the like connected to it can have substantial expanded capacity and/or higher data transfer rate. The processor employs an advanced adaptive data compression algorithm with string-matching and link-list techniques so that it is completely adaptive, and a dictionary is constructed on the fly. No prior knowledge of the statistics of the characters in the data is needed. During decompression, the dictionary is reconstructed at the same time as the decoding occurs. The compression converges very quickly and the compression ratio approaches the theoretical limit. The processor is also insensitive to error propagation.

16 Claims, 14 Drawing Sheets

DATA COMPRESSION/DECOMPRESSION PROCESSOR

This is a continuation of application Ser. No. 07/951,033 filed Sep. 24, 1992, now abandoned which is a continuation of application Ser. No. 07/568,363 filed Aug. 16, 1990, now abandoned, which is a continuation in part of Ser. No. 07/517,630 filed May 1, 1990, now abandoned.

BACKGROUND OF THE INVENTION

The present invention relates to a data compression and decompression processor and corresponding methods therefor.

Data compression/decompression techniques are well known in the prior art. Examples of prior art approaches are disclosed in U.S. Pat. No. 4,464,650 (the '650 patent), issued in August 1984 to Eastman, and U.S. Pat. No. 4,558,302 (the '302 patent), issued in December 1985 to Welch.

The above patents present implementations of a data compression algorithm described by Lempel and Ziv in "Compression of Individual Sequences Via Variable-Rate Coding," IEEE Transactions on Information Theory, IT-24-5, September 1977, pp. 530-537, and "A Universal Algorithm for Sequential Data Compression," IEEE Transactions on Information Theory, IT-23-3, May 1977, pp. 337-343. These two papers presented the original ideas and principles of compression algorithm. However, no implementation method was given.

Data compression algorithms are known as a discipline which design the shortest representation of the original data string. Reversible data compression implies that a given data string being compressed and then decompressed should be identical to the original data string, and not a single bit of information is allowed to be distorted or lost. This reversibility is identical to the concept of noiseless data compression in the context of information theory. Hence, noiseless data compression is quite different from speech compression and video compression where distortions are allowed. For typical applications of data compression for data being stored or transmitted, noiseless data compression is the only kind of compression which can be used.

The benefits of data compression are tremendous. The benefits of data compression technology to communications have been the increase in bandwidth available to the users and a savings of the cost of the communication device. For example, to transmit 9600 bps digital information over existing telephone lines requires conditioned lines and 9600 bps high-speed modems. If one applied advanced data compression technology with 4:1 compression ratio, one may use 2400 bps modems and unconditioned lines for such transmissions. In this example, the savings is not only the difference in modem cost between 9600 bps modems and 2400 bps modems, also the monthly charges for the conditioned lines. As a further example, a typical branch of a bank requires four leased lines for operation (one for the ATM machine, one for news broadcast, and two for data processing). If a multiplexer has a built-in compressor with 4 to 1 compression ratio, then only one line will be needed to communicate with the outside world, and a savings of monthly charges of three lines can be achieved.

As to back-up systems, data compression technology can greatly reduce the back-up time, increase the capacity and save the back-up device cost. For example, for the high-end ½" reel to reel tape back-up systems, typically four tapes are required to be mounted and dismounted from the tape drive system. It normally takes 30 minutes to back up one tape. Due to this sequential process, it becomes a very-time-consuming process to back up computer data.

If a back-up system has a built-in compression capability and compression ratio of 4 to 1, then one may use one tape instead of four tapes for the back-up purpose, and the back-up process becomes an unattended process. The other major benefit of data compression technology for back-up is that the person performing the back-up can simply mount the tape and leave the system unattended. By the same token, data compression technology can increase the capacity of the disk drive, reduce the data access time, and save the disk cost. Again, the savings are especially significant for high-end disk drive systems where multiple heads and multiple platters are required. With the help of data compression technology, only single head and single platter can be used to achieve the same capacity requirement. Due to fewer parts, this approach also improves the reliability of the system. However, these benefits will be realized only if the data compression technology meets each of the following requirements:

1. Its encoding process should be string-oriented rather than character-oriented in order to achieve good compression ratios.
2. The algorithm must be adaptive to the data source so that good compression ratios can be achieved for all data files. This capability is also called "universal" data compression.
3. Its data processing rate must be at least as high as the system data transfer rate so that system throughput will not be degraded.
4. The cost of data compression hardware implementation must be low. Preferably, the implementation of the data compression algorithm on a single VLSI chip is feasible.
5. The integration of the data compression technology into the system must be simple, and the data compression technology cannot cause any system problems.
6. The compression capability must be totally transparent to the users.

Currently, the most popular noiseless data compression method being used in the industry is the traditional Huffman coding or its modified versions. Huffman coding is a two-pass coding method. The first pass performs statistics collection of the data source; the second pass constructs a codetable based on the statistics collected. The underlying principle is to replace the more frequent characters by shorter codewords and less frequent characters by longer codewords. This coding method normally provides poor compression ratios because it is character encoding rather than string encoding.

To elaborate this point, consider encoding the more frequent words by shorter codewords and less frequent words by longer words. It is intuitive that the compression ratios to be achieved will be even better than compression ratios achieved by character encoding. For example, it is known that as the English word "the" is the most frequent word, so that it may be encoded by the shortest codeword. This is what is normally called encoding on the extended information source or multiple symbol encoding.

In general, the complexity and memory requirement of Huffman coding based on extended symbols (multiple symbols) source grow exponentially. For example, if the symbol size in the Huffman coding system is a byte, then the codetable requires 256 entries for character encoding. If the symbol size in the Huffman coding system is two bytes, then the codetable requires 65,536 entries for two byte encoding. For the particular example mentioned earlier, three-character encoding for "the" requires 16,777,216 possible entries for the codetable. Hence, practical implementation of Huffman coding has always been limited to character encoding only.

Typically, Huffman coding requires the same codetable to be shared or transmitted between the sender's and receiver's ends for successful compression and decompression. In practice, several classes of codetables are preassigned for data compression and decompression purposes. The compressor/decompressor switches to different codetables according to the closest match between the data source and the codetable. The resulting compression ratios are further deteriorated due to the mismatch between the source statistics and the codetable being used. Although it is possible to construct an adaptive version of Huffman coding, the implementation is cumbersome and the improvement on compression ratios is limited.

Since Huffman coding is a fixed to variable coding technique, the decompressor parses the compressed strings on a bit-by-bit basis until a legal codeword has been recognized. Because the length of the legal codeword is not known beforehand, the decompression process could be slow. The principle of Huffman coding is described in the article of D. A. Huffman entitled "A Method for the Construction of Minimum Redundancy Codes," Proceedings of IRE 40, pp. 1098–1100 (September 1952). In summary, Huffman coding suffers from several limitations:

1. It is a two-pass algorithm. The first pass involves the statistics collection needed to construct the codetable to be used by the compressor and decompressor. For many real life applications, this is unacceptable.
2. The compression ratio is less than optimal, since the complexity of multiple symbol encoding or string encoding is exponential, and practical implementation of Huffman coding has been limited to character encoding only.
3. The compression ratio is poor. Frequently, the codetable is mismatched to the information source. On the other hand, the implementation of adaptive Huffman coding is cumbersome and complex, and the convergence of the adaptive statistic collection is slow.
4. Since Huffman encoding is a fixed to variable length encoding, the compression algorithm itself is sensitive to error propagation and the decoding process could be slow.
5. The same codetable needs to be stored or transmitted between the compressor and the decompressor. This represents additional overheads for the compression purpose.

The first major effort to alleviate these limitations was the disclosure of the Lempel-Ziv algorithm identified above. Basic principles of Lempel-Ziv algorithm were described in the two papers cited above. The basic principles of Lempel-Ziv algorithm work as follows:

The compressor first prepares for a dictionary where variable length dictionary words will be stored. Initially, the dictionary could be empty or partially filled. Then the incoming string will be parsed and examined on a character by character basis, so that the longest match between the input string and the words in the dictionary will be identified. This is also called "greedy" parsing. As soon as the greedy parsing is completed, the extended substring of the longest match by one character will be entered into the dictionary as a new word, and the index of the word in the dictionary with a match to the longest substring of the incoming string will be output as a compressed word.

The decompressor will also prepare for a dictionary with the same principle to build and fill the dictionary as the compressor does. By examining the received indexes, the decompressor reconstructs the dictionary and performs the decoding process without physically storing or transmitting the actual contents of the dictionary from the compressor to the decompressor.

The preeminent features of the Lempel-Ziv algorithm are its ability to adapt to any type of incoming data source, and it extracts the longer and more frequent substrings from the data source as words stored in the dictionary with virtually no limitation on the length of the word as long as the local memory can accommodate them.

Indirectly, the Lempel-Ziv algorithm is performing dictionary construction on the fly and carrying out data compression in the sense of extended source encoding or string encoding. For example, if the word "international" is stored in the dictionary being matched to the incoming string and the size of the dictionary is 4,096, then only 12 bits are required to represent 13 byte word "international." Hence, a tremendous amount of compression has been achieved.

The Lempel-Ziv algorithm provides distinct advantages over Huffman coding for the following reasons:
1. It is a single-pass encoding technique and statistics collection is not needed.
2. It is string-oriented rather than character-oriented, so it achieves good compression ratios.
3. It is adaptive to the data source so that it becomes a good general purpose data compression algorithm.
4. The decompressor is able to locally generate the replica of the dictionary used by the compressor, based on the compressed strings, so that it is not needed to share the dictionary between the compressors and the decompressors.

The '650 and '302 patents identified above provide two different implementation methodologies for the Lempel-Ziv algorithm. In the implementation of Lempel-Ziv algorithm, two key components are the data structure used to store the input characters/substrings for the purpose of dictionary construction and hashing function used to perform the string-matching algorithm. In the '650 patent, the data structure is based on tree-structures, and data is processed two bits (or a fraction of a byte) at a time for a reasonable memory requirement, but the processing speed is slow. In the '302 patent, the data structure is based on a large hash array structure, and data is processed one byte at a time, and the processing speed has been somewhat improved. Both patents cover only the implementation of the compression/decompression apparatus but not applications.

The '650 patent made the first attempt to make the Lempel-Ziv algorithm practical and realizable in implementation. However, since the data structure is based on Tree structure, the compression apparatus only processes a fraction of a byte at a time, and the compression process requires numerous RAM cycles. Furthermore, the algorithm itself utilizes complex mathematics formulas and arithmetic operations such as multiply and divide.

The '302 patent made further progress on the practical implementation of the Lempel-Ziv algorithm. In essence, the compression processing is done one character (one byte) at a time. More importantly, the storing strings of input data character signals comprise prefix code signals and the extended character only. The storing strings in the dictionary are compared to the input data stream to determine the longest match.

It will be helpful to re-examine the six requirements for data compression technology to be useful for system applications. The Lempel-Ziv algorithm and the '650 and '302 patents only meet the first two requirements.

Notice that the compression throughput requirement varies according to applications. For example, high-speed modem applications require no more than 20 kilobits/sec. On the other hand, for today's typical peripheral applications, the Small Computer System Interface (SCSI) II requires data transfer rate up to ten megabytes/sec for the synchronous operation. Currently, the SCSI data transfer has become a common standard for peripheral applications.

As an example, assume that the nominal clock rate is 40 megahertz. This implies that the compressor and decompressor based on prior arts will have to process data at one character (byte) per four clock cycles. This also assumes extremely high-speed, expensive memories are being used in order to keep up with the fast clock rate. Hence, there will be very stringent compression throughput requirements for real-life peripheral applications. Besides, current bus structures being used in most computer systems are either 16-bit or 32-bit wide. This implies that more than a byte of information will be available at any given cycle time. Therefore, parallel data compression processing will be needed to meet such requirements in order to achieve high-speed throughput rate memory implementation cost to be manageable.

The other possibility to achieve high speed implementation based on prior arts is to de-interleave the input data string and use multiple 8-bit oriented compressors for compression processing. However, this de-interleaving process destroys the input data correlation structure, and hence degrades the compressor ratios significantly.

The application of compression apparatus based on the Lempel-Ziv algorithm and the '650 and '302 patents are limited in terms of their applications due to the following reasons:

1. They are single byte or a fraction of a byte processing. In the string parsing process, the hashing is done based on the next extended character and the content of the hash address. Hence, it is impossible to perform multi-character processing due to the sequential nature of the hashing process, and it is impossible to perform parallel processing based on these existing approaches.
2. They are sequential file compression. In other words, data blocks are chained together sequentially due to the use and construction of the dictionary. For example in order to read the 50th block of a 1 megabyte file, one needs to decompress the file from the first character until the 50th block is reached. The sequential file decompression implies that these techniques lack the random block access capability. This is absolutely unacceptable for disk random access environment.
3. The N-time hashing technique used in the string-matching process is non-guaranteed. Subsequently the compression ratio suffers and becomes poorer.
4. The dictionary has to be reset at the beginning of a given file. For block-oriented applications, such as synchronous communications, packet switching and disk environment, if a given block is treated as a file, then the dictionary is always reset at the beginning of every block, and the compression ratio suffers greatly. Since the dump dictionary is also partially filled and only shorter words are being stored in the dictionary. It is quite clear that adaptation and efficiency of compression for short blocks are incompatible; the learning cycle necessarily entails the initial construction in the dictionary of short strings peculiar to the incoming data, during which time even shorter strings are transmitted. It is not until long strings have been constructed that the system achieves high compression efficiency.
5. During the decompression processing, data is read in the reverse order from a stack. This also implies that numerous RAM cycles are needed just to decompress data.

In view of the foregoing, it would be very desirable to provide an improved data compression/decompression processor and corresponding methods which overcome the deficiencies and limitations of prior art approaches.

SUMMARY OF THE INVENTION

It is one object of the present invention to provide an improved data compression and decompression processor and method.

A data compression technique according to the present invention is able to process multiple characters (parallel processing) concurrently with no extra memory requirement and no degradation in compression ratio. The novel implementation of the present invention provides a low cost, high speed reversible implementation of data compression that provides an information processing capability that can be integrated as part of disk, tape back-up and communication systems.

According to one aspect of the present invention, a data compression processor and corresponding method provides the capability of parallel symbol processing. The present invention processes multiple bytes of data simultaneously by computing all of the dictionary addresses for possible matching substrings. The post processing phase of the data compression system provides the parsing of the input data stream and the output indices in parallel.

According to another aspect of the present invention, a parallel data decompression processor and method provides parallel output symbols without a stacking requirement. This eliminates numerous RAM cycles in data decoding and significantly improves the decompression throughput. The decompressor accepts one index at a time and traces multiple dictionary trees from the top down, producing multiple bytes at each cycle in the right order.

Other aspects of the present invention include the following:

New compression data structure and new hashing function (a function of character and address) to make parallel symbol processing possible with no extra memory requirement.

Guaranteed successful hashing function due to the uniqueness of the data structure. The significant impacts are faster compression processing rates and better compression ratios.

New decompression data structure links the bytes in the right order instead of from the leaves to the root. This data structure utilizes common substrings in the dictionary words to reduce memory requirements.

Block-oriented compression algorithms are made possible due to the use of special codewords so that successive blocks are compressed and decompressed independently without sacrificing the compression ratios or resetting the dictionary.

Provide means to indicate the dictionary is full, hence future compression is merely a table look-up approach. This feature gives random block compression capability. This is especially important for database applications.

Provide guidelines and means to reset the dictionary if the compression ratio is poor.

Provide an inherent means for error detection due to the channel error for error protection purposes.

Provide a free encryption capability which is a function of the user's key via either an enlarged initial seed dictionary as a function of the user's key and/or randomized code signal generation based on the user's key.

Capability to perform block reread and retransmit by only having to save the index counter value between subsequent blocks. Only the block oriented approach makes this possible.

Capability to handle multi-tasking environment by keeping pointers to different dictionary locations either in memory or on the disk/tape. Each block will point to the location of the beginning of its dictionary and a table look-up scheme will determine whether or not the dictionary is already in memory.

Capability to selectively compress blocks of a given file and leave other blocks uncompressed to guarantee that the compression ratio will always be better than or equal to 1.

Capability to handle multiple file processing environment. For random compression/decompression, store the starting address of each dictionary and keep track of which dictionary is currently used.

The present invention provides solutions for the integration of data compression into system controllers and applications (disk applications, multi-tasking environment, communications, tape back-ups and CDROM.

The present invention provides a dramatic improvement over approaches such as taught by Lempel and Ziv. The end result is a significantly superior compression algorithm to provide a faster (higher processing throughput), better (better compression ratio) and cheaper (a single VLSI chip solution) compression solution. Due to this new invention, it is feasible to implement a low-cost, high-speed, multi-application versatile data compression apparatus for disks, communications, tape back-ups, CDROM and printer applications.

Other objects, advantages and features of the present invention will become apparent from the following detailed description when taken in conjunction with the accompanying drawings.

BRIEF DESCRIPTION OF THE DRAWINGS

The accompanying drawings which are incorporated in and form a part of this specification illustrate an embodiment of the invention and, together with the description, serve to explain the principles of the invention.

DETAILED DESCRIPTION OF THE DRAWINGS

Reference will now be made in detail to the preferred embodiment of the invention, an example of which is illustrated in the accompanying drawings. While the invention will be described in conjunction with the preferred embodiment, it will be understood that it is not intended to limit the invention to that embodiment. On the contrary, it is intended to cover alternatives, modifications and equivalents as may be included within the spirit and scope of the invention as defined by the appended claims.

Before going into detail with respect to a data compressor/decompressor processor, reference will first be made to an improved compression/decompression system and method. The details of such an improved compression/decompression system and method are set forth in the above identified cross-referenced and co-pending application, the details of which are hereby incorporated by reference.

Figure 1:
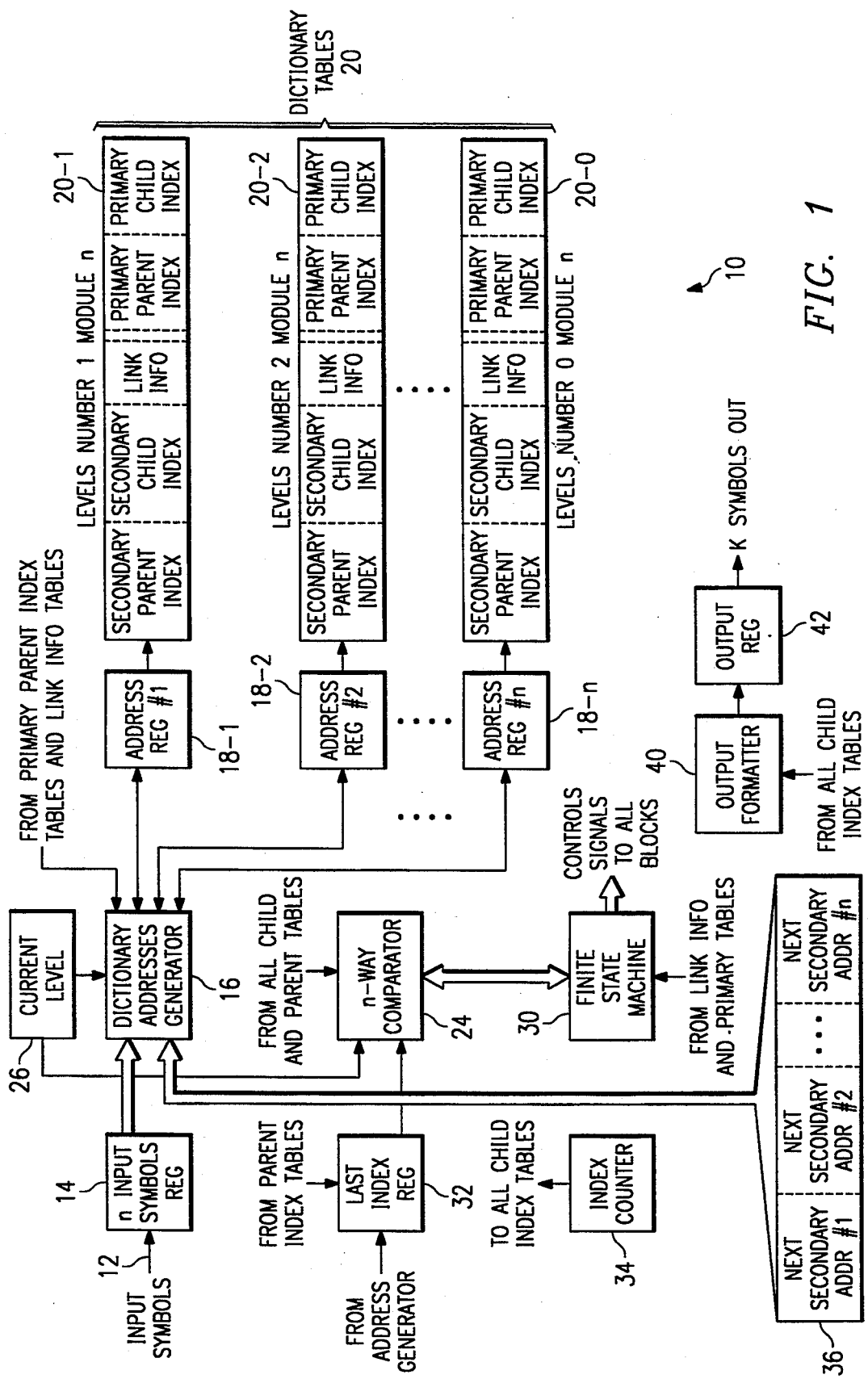
FIG. 1 depicts a block diagram of a parallel data compression system which can be utilized with the present invention.

Referring now to FIG. 1, a parallel compression system 10 which could be utilized with the present invention is depicted as a block diagram. In FIG. 1, input symbols 12 are input into N-input symbol registers 14. Typically, there are N symbols being input into register 14 at the same time. Common examples are 2 or 4 bytes of data. The input symbol register 14 feeds the input symbols to several places. One input is to the dictionary address generator 16 that generates all the addresses to N dictionary tables 20. Dictionary address generator 16 receives other inputs, as will be discussed.

An address is generated for each of these tables 20. The dictionary tables are indexed by levels 1, 2 up to level number 0, modulo N. So there are N of these tables and each one has its own address register 18. So there is address register #1 for levels number 1, modulo N, and so on. The dictionary address generator 16 generates all the N addresses in parallel and then reads back from all the different tables in each of the dictionary tables 20.

Each of these dictionary tables 20 includes five sub-tables. The sub-tables include a secondary parent index table, a secondary child index table, a link information table, a primary parent index table and a primary child index table. The system first looks into the primary tables. If the system cannot find what is wanted, then it goes to the secondary tables based on a flag bit stored in the primary child table. The system 10 of FIG. 1 includes the N-way comparator 24, which takes data from all of the parent tables.

Initially, the system 10 generates addresses for the primary parent and child index tables. If the parent index tables following the table indexed by the current level register 26 find a match with the last index register 32, then the N-way comparator 24 will detect that match.

The system 10 reads all the parent index tables comparing with the last index register 32 and with child indices from child table 20, as will be described in FIG. 2.

In FIG. 1, a finite state machine 30 controls the other components. State machine 30 is a control circuitry that generates all the control signals to read and write the needed quantities at the proper times. The output register 42 outputs the index of the word the system is looking for in a dictionary 18. As an example, the word "the" will have an index of 250 so the system outputs the number 250 represented by some number of bits depending upon the state of the circuit. The output indices can be represented by a fixed number of bits if a variable to fixed mapping is desired. Alternatively, a variable number of bits can be used that depends on the value of the index counter 34. The N-way comparator 24 finds the best parsing of the input string and then outputs a sequence of indices to the output formatter 40. The formatter 40 packs these variable length indices into byte boundaries, because the system typically outputs 16 or 32 bits (N=2 or 4).

The output register 42 can be of any desired size, preferably the same size as the N-input symbol registers 14. If the system bus width is 32 bits, it would be desirable to get 32 bits out from the output register 42.

The index counter 34 sequentially assigns indices to new words created in the dictionary. Several examples will be described that will show this operation. Basically, it starts from some number and sequentially assigns indices to each of the following words to be added to the dictionary table 20.

The starting value for the index counter 34 is 255+the number of special index values used to send special messages to the decompressor. For example, one special index would indicate a dictionary reset has occurred; another special index indicates the end of compressing an input block without resetting the dictionary.

The data structure of the dictionary can be viewed as a multi-tree structure. For example, words consisting of a single symbol will be in level 1, Modulo N table 20-1. The second symbol of words consisting of two symbols will be in level 2, Modulo N table 20-2. Similarly, the sixth symbol of words that have six characters, for example, would be in the level 2, Modulo N table (if N=4). The level is the number of characters in a dictionary word.

The system can process all N input symbol registers 14 concurrently. By splitting the dictionary 20 into N separate dictionaries, the system can look into all N dictionaries at the same time. At the same time, the state machine 30 is implementing a data structure that sends these words into the different levels. The data structures allow the system to implement parallelism while the prior art data structures are not capable of handling more than one symbol at once.

The basic problem in the prior art is that the prior art works in a sequential mode to get a character in, takes that character plus some number in a last index register and combines them together, produces an address into a table, takes a content of the table, gets the next character, combined with the last content of the dictionary produces the address where the next match might be. For example, character number 1, will get to location address number 1. The prior art architecture takes the content that is pointed to by address number 1, plus character number 2, and produces address number 2. The prior art looks up the table at each character boundary in order to know where the next entry might be.

In one embodiment, the present invention creates N addresses at the same time, so the address is not dependent on the content of the dictionary 20. It is only dependent on the previous address and input symbol. The system of FIG. 1 relies on the contents of the table in order to generate the indices that make the compressed string.

The system 10 of FIG. 1 also includes a next secondary address 36 (numbered from 1, 2, ..., N). Registers 36 are sources of addresses into the secondary parent index table, the secondary child index table and the link information table. These addresses are input to the dictionary address generator 16. If the system has to go to the secondary address tables, it depends on the next secondary address registers 36 to find these addresses.

Address generator 16 generates addresses to the primary tables as well as the secondary tables. The sources of the primary addresses are the input registers 14 and the address registers 18. The addresses to the secondary tables are generated from the next address counters 36, the primary parent tables and the link info tables.

The system 10 employs three flags in the dictionary tables to direct the searching and matching process. A flag set in the primary parent table indicates an available primary location. A flag in the primary child table indicates a previous collision at that location with the address of the list of colliding items given by the corresponding content of the parent primary table. A flag set in the link info table indicates the end of the list of colliding items.

In FIG. 1, system 10 also includes a current level register 26 which indicates the depth of the current dictionary word. This register is used by the address generator 16 to compute the table addresses. For example, if the system is at level number 3, then at the next match it will try to look at level number 4, modulo N.

So that would be the next level and then the address generator 16 will properly assign the addresses.

Figure 2:
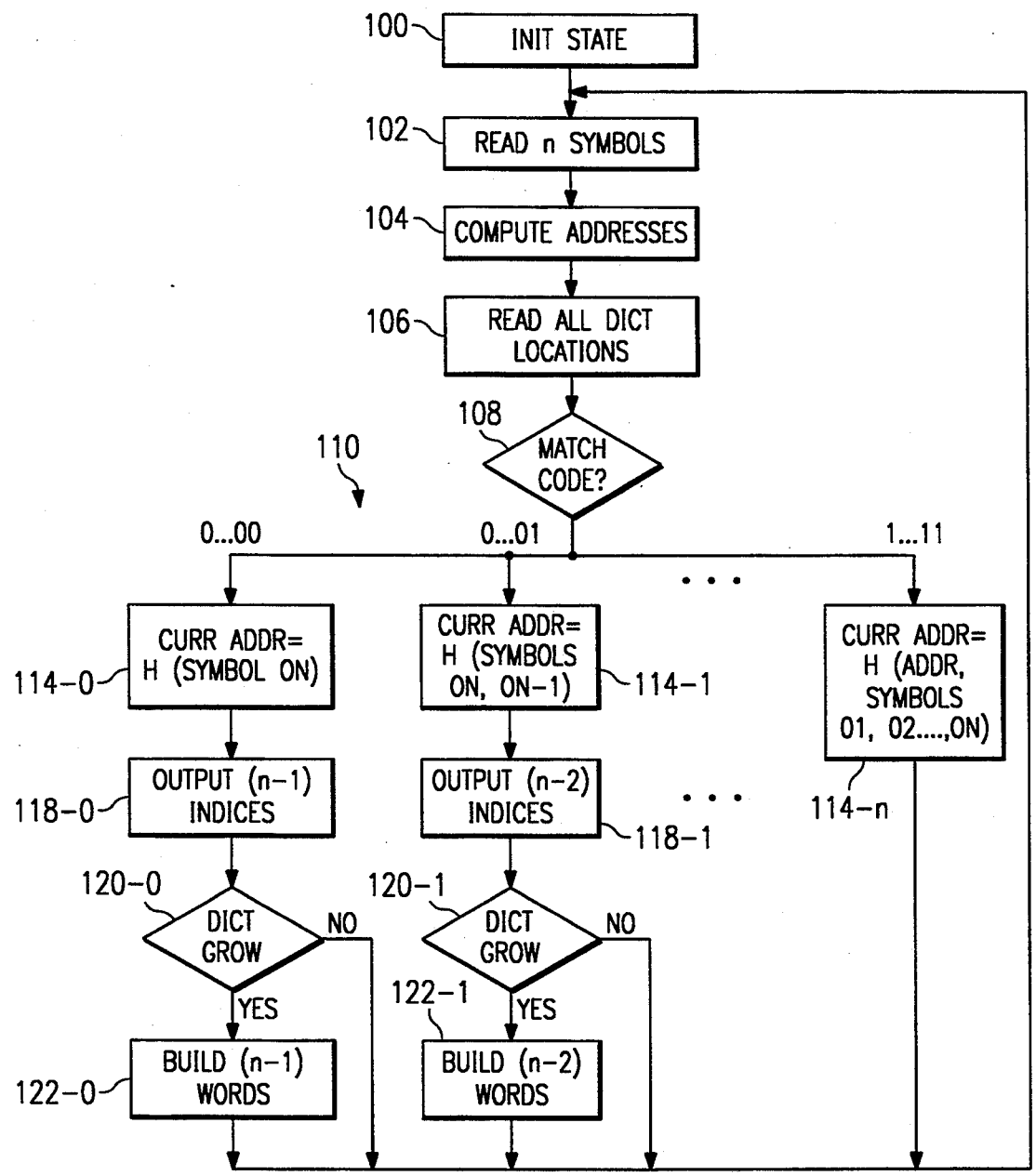
FIG. 2 depicts a generalized flow chart illustrating an improved data compression technique which can be utilized with the present invention.

FIG. 2 depicts a flow chart for a general number N for the compression process where N is the number of input symbols.

In FIG. 2, the system starts with an initialization state 100 and then reads N symbols in state 102. All the N symbols are entered into the address generator 16 of FIG. 1 which computes all the addresses into the different tables in state 104. All the addresses are loaded into the correct primary address port of corresponding tables. The system reads all the dictionary locations at all of the addresses that were provided at state 106. At this point, the system has enough information to determine where are the matches. State 106 reads all the dictionary locations including the secondary address information.

Next, at state 108, a match code is generated. The match code is the output of the N-way comparator of FIGS. 1 and 2. For example, the match 1-1 signal corresponds to bit number 0, the match 1-2 corresponds to bit number 1. The number of bits is equal to the number of comparators in that triangle and the system produces a code. The comparator provides a code of where are the matches. If the code is all zeros, it means that it didn't find any match, which means that all of the symbols correspond to first level matches.

In this case, the system processes all input symbols accordingly. If the match code is equal to 00...01, then the system found only one match and the rest were all first level symbols.

If the match code is 111...1, then all input symbols extended from the current level are matched. In this case, no output needs to be generated, and the next N input symbols are read. The system updates the values of the current level 26 and the last index register 32. The address corresponding to the last match is also stored to enable the system to compute the primary addresses for the next N-input symbols.

The system 10 will output an index for each zero bit in the match code, i.e., for each mismatch. The exception to this rule is for the most significant bit of the match code where a zero means that current level 26 will have a value of 1 and the next N-input symbols will start the matching from level 1.

For example, if there is a single 0 and then all 1's, the system outputs the single index corresponding to N-1 matches. Then the last one did not match, so that it is represented as a first level. If the match code is 0...01, then there is a single match (and all the rest there are no matches, which means that there are N−2 indices), which is the one that corresponds to the first input symbol being concatenated with the current node and then every 0 afterwards corresponding to a single level symbol that was not matched by the following symbol, so that becomes the longest match.

For a finite memory size, the number of words in the dictionary, henceforth referred to as the dictionary size, has to be fixed. So with every mismatch encountered, the system 10 adds a new word to the dictionary, assigning the next available index to the new word. The index counter 34 provides the next index value for each word added to the dictionary in a sequential manner. When the value of the index counter 34 reaches the preassigned dictionary size, a "dictionary full" flag is generated. When a "dictionary full" flag is set, the dictionary growing process is inhibited until a "dictionary reset" signal is generated, upon which the index counter gets reset to its original value.

If the system can grow the dictionary, then it builds as many words as it outputs indices. If one mismatch is encountered, the system will build one extra word corresponding to the last word concatenated with the mismatched symbol. FIG. 2 shows a general view of how the whole structure works, reading symbols, computing addresses, getting all the information from a dictionary, resolving all the information with a match code, and generating the compressed string.

The system is collecting all the information about all the different words at the same time, computing the match code which directs the system to the right branch. Each of the branches 114 in FIG. 2 implements the dictionary growing phase of the compression process. The number of words to grow is determined by the match code. The matching process also retains information regarding the location of the extension symbol (primary or secondary address . . . ).

A match code is an $(\frac{1}{2})N(N+1)$-bit quantity and a bit is 1 if the corresponding match was there and they actually are the output from the N-way comparator. As an example in FIG. 2, N=3. If 011001 is the bit pattern, it means that the first symbol was a match, the second symbol was not, the third symbol was not and so on. Every one of these bits will indicate which symbol was a match and which words need to be extended.

Figure 3:
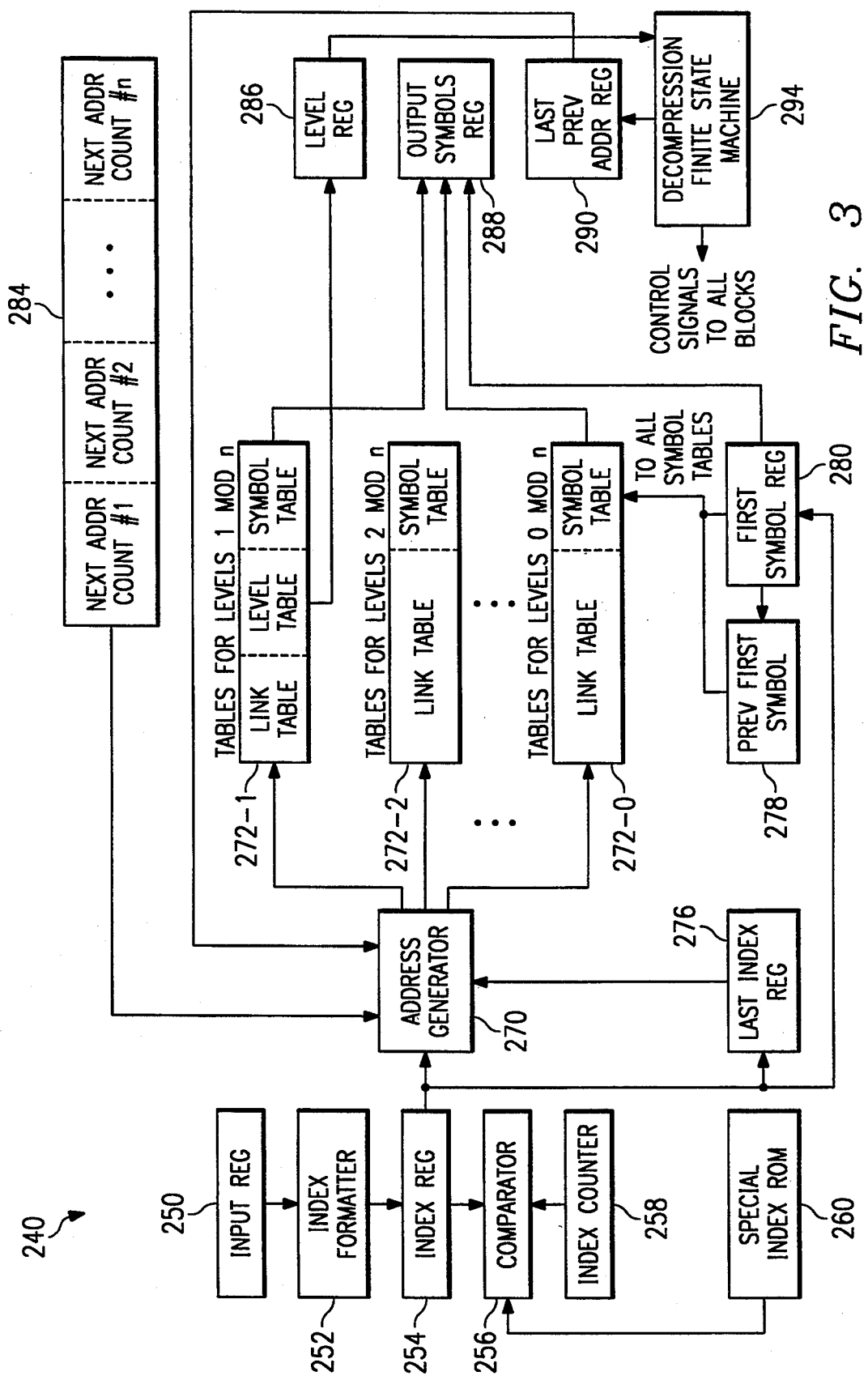
FIG. 3 depicts a block diagram of a parallel data decompression technique which can be utilized with the present invention.

Referring now to FIG. 3, a block diagram of a parallel decompression system 240 which can be utilized with the present invention is depicted. The parallel decompression system works in a different way from the compression system. The parallel compression system takes in multiple input symbols and tries to find multiple matches at the same time. The decompression is getting an index and that index in its dictionary corresponds to a word of some length, so the parallel decompression will try to output a number N of these symbols from that word in parallel. Formatter 252 is a shifter that unpacks the indices from the input symbols and loads an input index in the index register 254.

The input index goes to several places in order to build N different tables 272. That number N may not correspond to the same number N on compression as they are actually uncorrelated, but in practice N is dictated by the bus width of the whole system, which is typically 2 or 4. The system has N tables 272 (for level 1 mod N up to 0 mod N).

The table 272 is composed of two sub-tables except for the first one. The first one 272-1 holds a level table as well. Once an index is received, the level table tells how long is the word that corresponds to this index, so it knows when to stop. All the other index tables are only comprised of two sub-tables. One is for a symbol and one is for a link. The symbol table holds the current character and the link points to the next level.

Address generator 270 takes the index as an input and produces an address to all levels. The symbol table 279-1 contains the first level character din that word (a string of characters). The second character will be in table 2. The third and fourth up to Nth character will be in the corresponding table. There are N-linked lists here for each word, so each table will hold one linked list per word (link through the link-table information). The system takes the index and outputs into all the N different tables 272. The first table 272-1 will output the first symbol, the second table 272-2 will output the second symbol. The system knows how many to get because it reads the level from the level table. At the output 288, it has a variable number of symbols coming out because it depends on how long the word is, so the output 288 will format these bytes to N-symbol quantities.

The contents of the link tables are loaded into the address registers, so if the length of the word, which is stored in the level table, is greater than N, the symbol and link tables are read. This process continues until all the symbols in the word are read.

Regarding the Special Index ROM 260, the system reserves a number of indices. Indices from 0 up 255 are reserved for first level characters. Some number of special indices are reserved for messages from the compression system to the decompression system. One example of special indices is that if the compression decides that the current dictionary is not matching to the input string. For example, it monitors the compression ratio and detects deterioration in the compression ratio. The compression sends a special index to the decompression, resets the dictionary memory and resets the index counter to its original value. Upon receiving the special index, the decompression resets its dictionary memory and index counter 258.

Another special index is reserved for independent block operation. This special index is sent from the compression system after the end of an input block has been reached and the compression system was instructed to compress individual blocks independently. The compression system terminates the matching process and outputs the last index 32, then flushes out the remaining bits after sending the special index.

Upon receiving that special index, the decompression system 240 will use the available bits remaining; instead it will read new input bytes, since those remaining bits are padding bits the compression system used to separate the compressed blocks. This technique is very effective in achieving a high compression ratio while separating the compressed blocks.

A comparator 256 of FIG. 3 compares the input index with the special indices stored in the special index ROM 260. The same comparator 256 compares the input index with the value of the index counter 258. If the input index is equal to the contents of the index counter 258, then the previous index is used in the decoding instead of the current input index, since the word corresponding to that input index is not generated yet. If the input index is larger than the index counter 258, then an error will be generated. This capability provides a limited error detection.

The last index register 276 is used in the case when the index register 276 is equal to the index counter 258. The first symbol register 278 and the previous first symbol register 280 are used to build a new word in the dictionary which is the word corresponding to the previous index concatenated with the first symbol in the current word. The previous first symbol register 280 is loaded in the symbol table at the address given by the index counter. The previous first symbol will point to the rest of the previous word and the first symbol 278 becomes the extension symbol.

Suppose TH is a word whose index is X. So X will point to T and then T will point to H. The word THE will have a different index. So it will actually have to start at a different location in the dictionary.

So the first symbol in the previous word, T, is stored at the symbol table at the location pointed to by the index corresponding to THE. The link table points to "H" which does not need a new memory location. The last symbol in the new word is stored at a location pointed to by H, that last symbol E is stored in the first address register.

All the N tables 272, in particular the symbol tables, feed into the output symbols register 288.

The level register 286 is loaded with the contents of the level table and keeps track of how many symbols have been output so far. The last previous address register 290 keeps the last word ending address to link the extension symbol. There is a state machine 294 that controls all the blocks of FIG. 3.

There is a next address counter 284 for every table that holds the address of the next available location in the table for entering extension symbols as well as some intermediate symbols in case two symbols become children of one node.

The prior art starts decompression from a leaf or an internal node of the tree, so the input index points to the last symbol in a word; the output characters are stored in a stack. Then symbols are output in reverse order. In the present invention, the input index points to the first character in a word, because every word has a first level character. The system looks up the level table first, figures out what the number of symbols in a word are, and starts decompression from the top. The prior art has to read the level first and then decide where to start pointing. The present invention can decide everything in parallel. It knows that the first character has to be in table 272-1, so it reads it and at the same time reads the level and decides whether it needs more symbols from tables 272.

Figure 4:
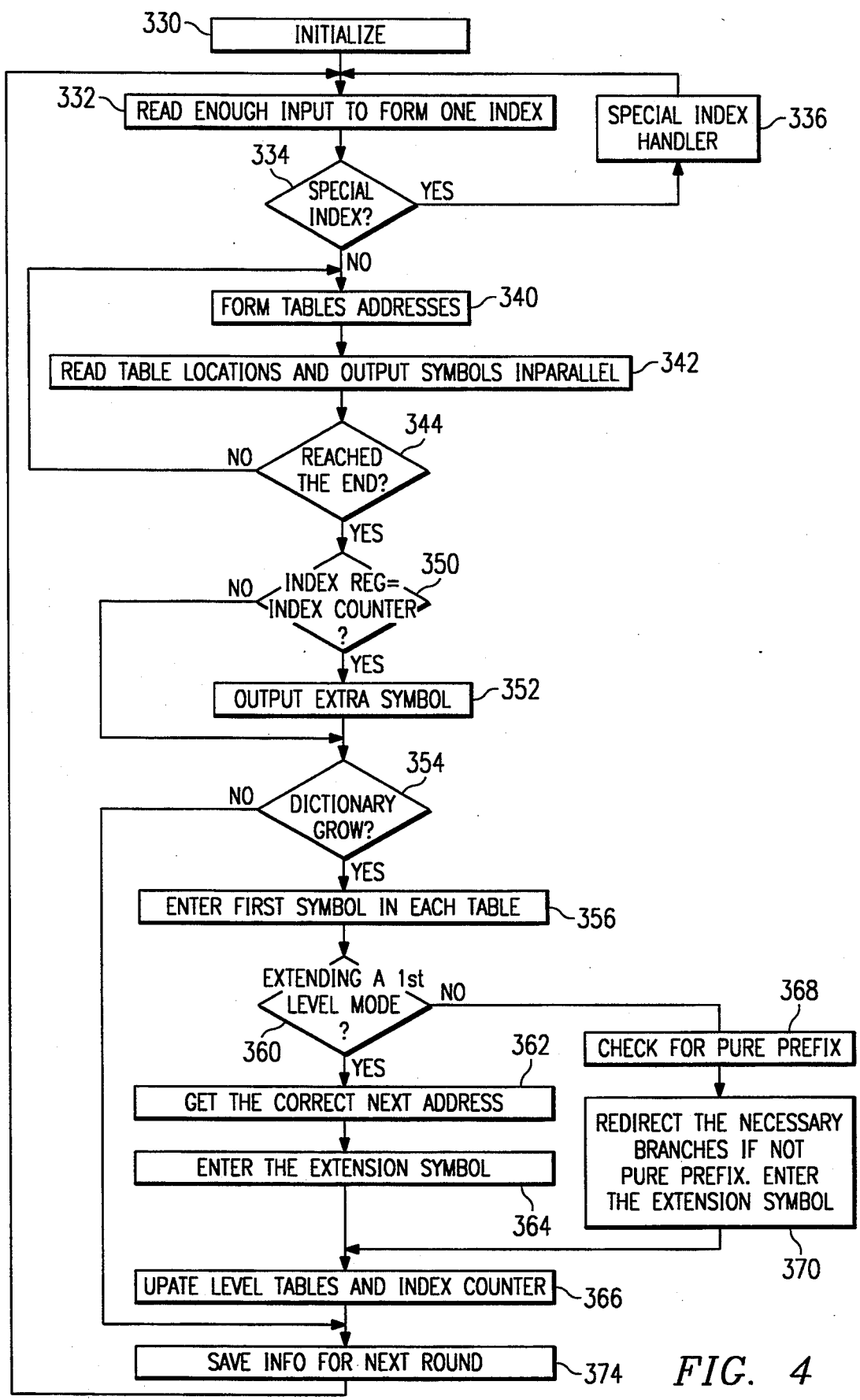
FIG. 4 depicts a general parallel data decompression flow chart.

FIG. 4 depicts a general parallel decompression flow chart designed for some number N of parallel output symbols.

In FIG. 4, the system starts from initialization state 330 which initializes all the counters. Block 332 reads enough inputs to form one index, which depends on how many bits the system is reading from the input bus that will form an index. (It constructs one index at a time.) That will be stored in the index register 254 of FIG. 3 and compared with the special indices in block 334.

If it is not a special index, the normal decompression process starts. First the system computes the addresses for the tables in block 340. The first address is equal to the index register 254 content or the previous index register 276, then reads all the table locations (block 342) and with the level information it knows how many symbols are valid. If more symbols are needed, this means that it has not reached the end of this word. In this case, the value of the link table becomes the address to the table.

The link table content will provide the information where the next symbol is until the end of the word is reached. It then tests if the index register is equal to the index counter. If it is, then there is an extra symbol that needs to be output, since in this case, the word length is one more than the last index received. This extra symbol is equal to the first symbol in the last word.

The system goes to dictionary growing routine (block 354). The system compares the index counter with the dictionary size. If they are equal, then the dictionary growing routine is skipped, and the system goes to block 274.

The system needs to save the first character and the last previous register, the address register, and the last index, shown in FIG. 3.

Parallelism is not required for growing a word in the dictionary, since only one word is involved. The content of the first symbol register is stored in the symbol table 272-1 at the address given by the index counter 258.

There is a first symbol (block 356) in each of the tables 272. The first symbol is very critical because that's where the index points to. Every symbol from now on will point to the next one.

If the word to be extended has length smaller than N, then the extending symbol is entered in the appropriate table 272 at the address given by the index counter 258, and the first symbol register is entered in table 272-1 at the same address. If the word length to be entered is between N and 2N−1, then the extension symbol is entered in the appropriate table 272 at the address given by the appropriate next address counter 284. The corresponding link table at the address given by the index counter 258 will be loaded with the corresponding next address counter 284.

If the word to be extended is larger than 2N−1, then the system checks for a pure prefix (block 368) which means that it checks whether the previous word to be extended has any other children words. That is, a leaf node will be called a pure prefix. In this case, one symbol needs to be entered with the appropriate link. If the pure prefix condition is not satisfied, then all the intermediate symbols are copied to new locations, preserving the link information.

Another way to do this would be to do hashing when a node has two children. This is a way to avoid hashing.

Figure 5:
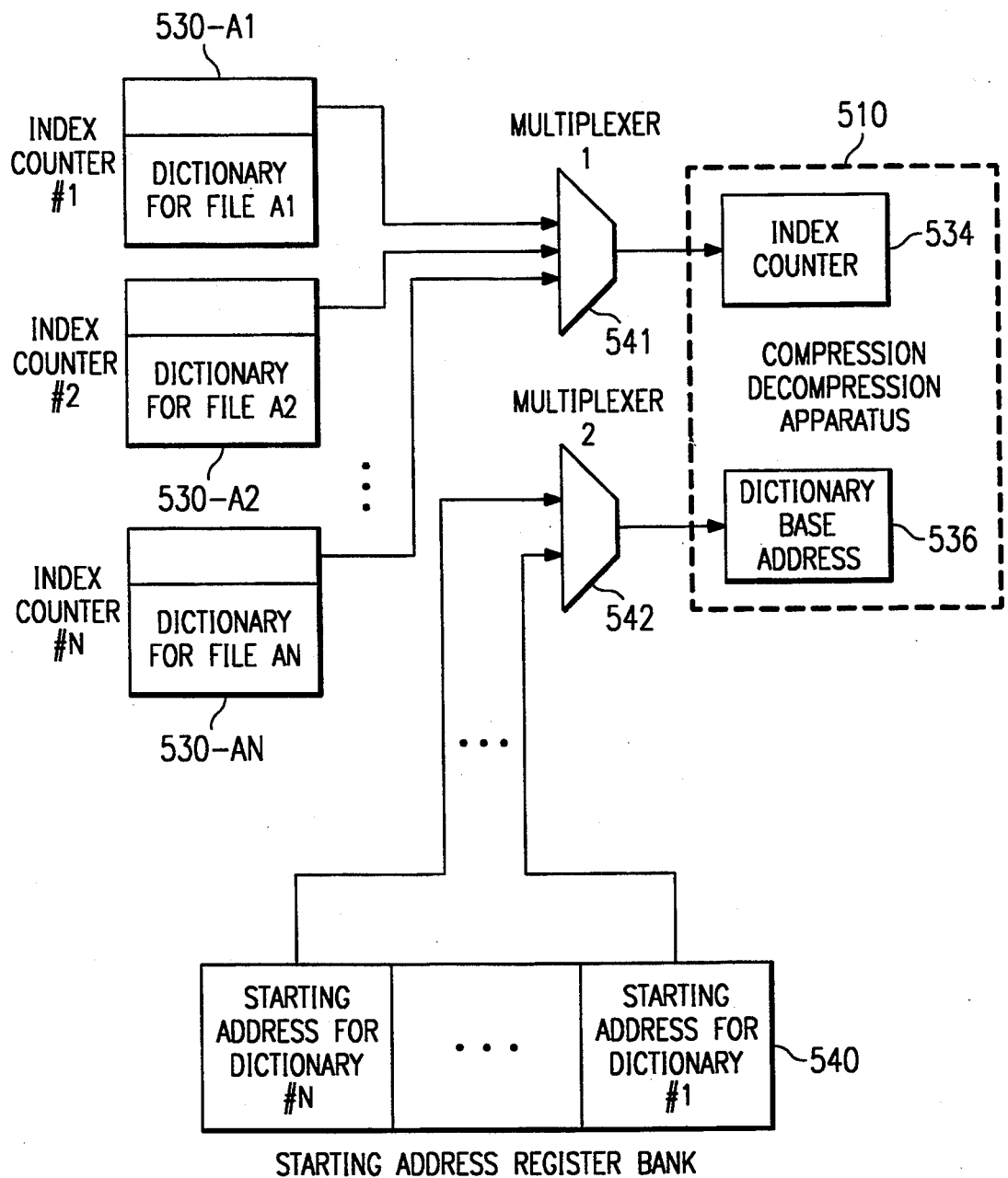
FIG. 5 depicts a multi-file operation block diagram.

FIG. 5 depicts an example of how a multi-file operation or multi-tasking operation would work in conjunction with the present invention. In FIG. 5, there is a compression/decompression apparatus 510, which includes an index counter 534 and a dictionary base address 536.

In a multi-file environment, the system includes multi-dictionaries 530 with one dictionary per file (A1, A2, ..., AN).

The system needs to supply the compression/decompression apparatus with the base address 536 or where the dictionary for the current file actually resides.

Associated with every file A1, A2, ..., AN is an index counter 1, 2, ..., N. If the system starts compressing, say, file A1, the first block of file A1 gets compressed, and then the final index counter after compressing one block of file A1, will be stored in the index counter 1.

The next block might belong to File A2. The system would go to index counter 2, bring the content of index counter 2 into index counter 34. Multiplexer 542 permits the starting address of dictionary A2 to go into dictionary address 536 in the compression apparatus 510. This allows the compression apparatus to access the dictionary for file A2.

Starting addresses for dictionaries A1 through AN would be stored in starting address register bank 540.

Starting address register bank 540 is basically N registers, each one holding the base address of the associated dictionary. If the current block comes into file A3, the starting address register 3 will back through multiplexer 542 and be stored in dictionary base address block 536.

Using this mechanism, the compression/decompression apparatus will be able to toggle between blocks and between compression and decompression. For example, the system can start compressing a block of file A1, write it out and then decompress another block of file A3.

What the system does is set the apparatus to do decompression, give it the right starting address (the dictionary base address), the associated dictionary would be the decompression dictionary table for file A3.

The foregoing aspects of an improved data compression and decompression system is desirably incorporated into a data compression/decompression processor, according to the present invention, the details of which will now be described.

In a preferred embodiment, the present invention is a single-chip VLSI data compression engine for use in data storage applications. This VLSI circuit is highly versatile such that it can be used on a host bus or housed in host adapters so that all devices (such as magnetic disks, tape drives, optical drives, WORMs and the like), connected to it can have substantial expanded capacity and/or higher data transfer rate.

The present invention desirably employs an advanced adaptive data compression algorithm with string-matching and link-list techniques as described above. Compared with conventional data compression algorithm (such as Huffman coding) the improved algorithm has the following advantages. It is completely adaptive. During compression, the dictionary is constructed on the fly. No a priori knowledge of the statistics of the characters in the data is needed. During decompression, the dictionary is re-constructed at the same time as the decoding occurs. It converges very fast, and the compression ratio approaches the theoretical limit. It is also insensitive to error propagation.

Figure 6:
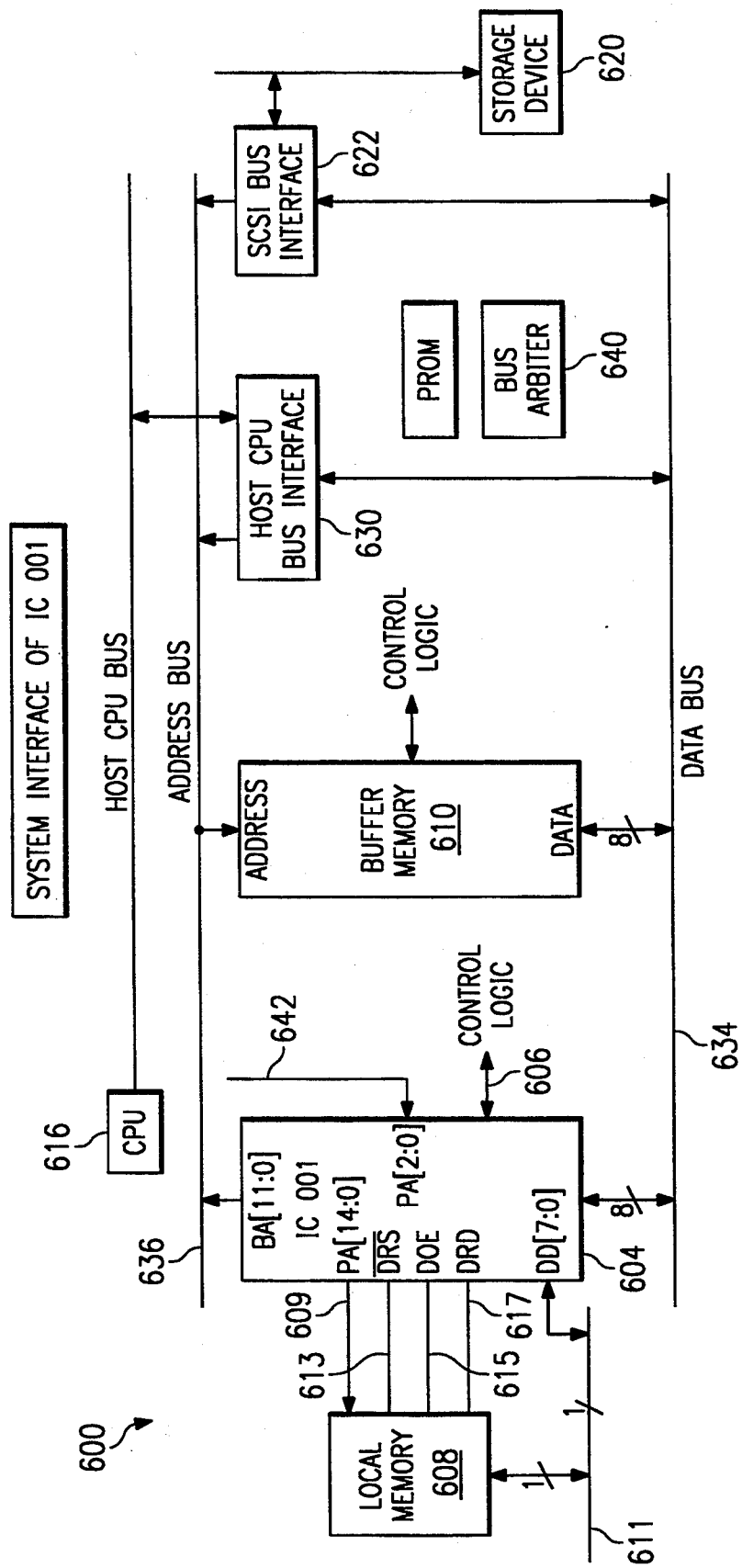
FIG. 6 depicts a block diagram of a system interface application including a data compression/decompression processor according to the present invention.

Referring now to FIG. 6, a block diagram of the present invention interfaced with a desired application 600 is shown, which is one of the possible applications of the present invention. In FIG. 6, the compression/decompression processor 604 is connected to a local memory 608 of 32K×8 bits for the dictionary. The original data and the compressed data will be stored in the buffer memory 610. The control logic for both the local memory 608 and buffer memory 610 are included within the processor 604 (which desirably is a single-chip).

Processor 604 includes eight control registers, into which users can load various commands as well as the configuration of the system such as whether the chip 604 is in compression or decompression mode, whether resettable local memory is used, and the like. The results of the compression and decompression are reported in the status registers.

For data security applications, the processor 604 also implements key-dependent encryption capability. Users just load the key words on the chip and the data output to the buffer will be encrypted.

Processor 604 is designed with advanced CMOS technology, housed in a 68-pin PLCC(Plastic Leadless Chip Carrier) or a 80-pin QFP(Quad Flat Package).

System Interface

For the application example, processor 604 appears to be an integral part of the buffer memory 610 of FIG. 6. After data from CPU 616 (uncompressed data) is stored in the buffer memory 610, processor 604 will intercept the data and start compression operation. The compressed data is then sent back to the buffer 610 to be stored in storage device 620. On the other hand, as the data is retrieved from the storage device 620, it is stored temporarily in the buffer 610, from which processor 604 will recover the original data by decompression before it is sent back to the CPU 616.

The system interface configuration is shown in FIG. 6. Processor 604, buffer memory 610, storage device 620 (via SCSI interface 622), and the host CPU 616 (via host CPU bus interface 630) share an eight-bit DATA BUS 634. In addition to data, commands and status are also transferred through the DATA BUS 634. Storage device 620, processor 604 and host CPU 616 can address the buffer memory 610 through the ADDRESS BUS 636. A bus arbiter 640 will arbitrate the use of the DATA BUS 634, using a bus protocol scheme such as a round-robin scheme. That is, time windows are assigned to processor 604, CPU 616 and storage device 620 in a sequential manner. For example, a signal will indicate to processor 604 that the DATA BUS 634 is free for use in that time slot. If processor 604 is ready for data transfer, it will grab bus 634. Otherwise, it will pass up the opportunity and wait for next round.

A typical scenario would be like this: CPU 616 starts writing into the buffer memory 610. After 4K bytes are filled, CPU 616 will signal processor 604 to start compression. At this point, processor 604 will fetch data from and write compressed data to buffer memory 610. While the compression operation is taking place, the CPU 604 can write data in the next 4K segment at the same time. If the compressed data makes up a 4K segment, storage device 620 will fetch this segment immediately. Therefore, up to four simultaneous operations can take place:

i. CPU 616 writing data to buffer memory 610.
ii. Processor 604 fetching data form buffer memory 610.
iii. Processor 604 outputting data to buffer memory 610.
iv. Buffer memory 610 outputting data to storage device 620

The on-chip control registers and status registers are addressed by CPU 616 via the address inputs PA[2:0]642.

Processor 604 also interfaces with local memory 608, 32K×8 bits, which is addressed by the address lines DA[14:0]608. Data transfer between the local memory and processor 604 is via DD[7:0] 611.

Processor Architecture and Funtional Description

Processor 604 includes two parts: the core and the controller interface. (Refer to FIGS. 7A and 7B.)

The core has the data path, the associated state machines and the interface to local memory 608.

The controller interface includes I/O logic to format input data and output data, the state machines (core and interface) and registers and counters.

Figure 7A:
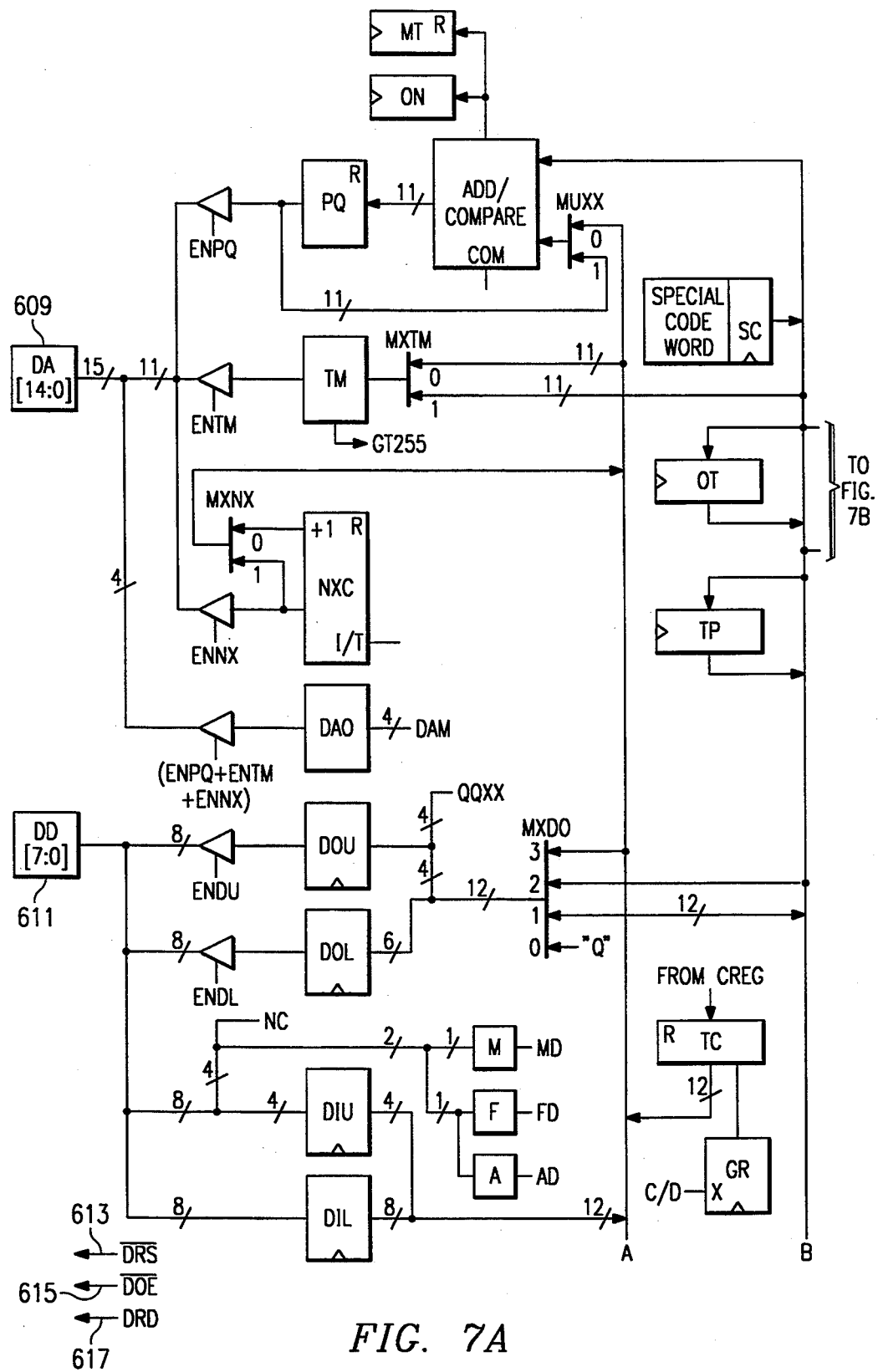
FIGS. 7A and 7B depict a more detailed diagram of the improved compression/decompression processor according to the present invention.
Figure 7B:
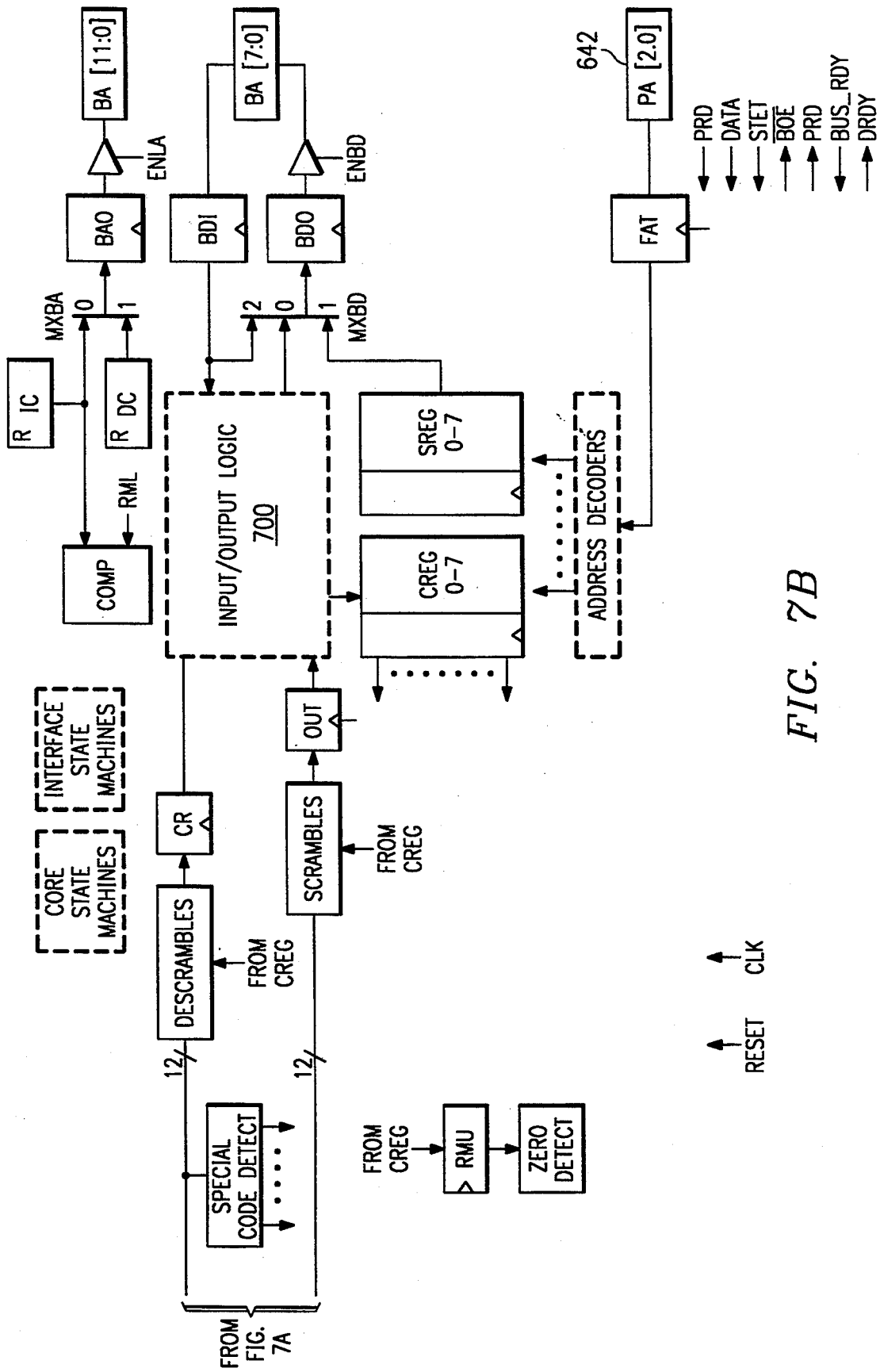

In FIGS. 7A and 7B, the data path is formed by two 12-bit busses, the A—Bus and the B—Bus, a 12-bit adder/comparator, an 8-word ROM which stores special code words, state machines to control various operations, and registers, multiplexers and counters.

There are eight 8-bit control registers (CREG 0–7) and eight 8-bit status registers (SREG 0–7). They can be accessed through BD[7:0] and PA[2:0].

All registers and counters are 12-bit wide unless otherwise specified.

Registers (FIGS. 7A and 7B)

Input/Output Register for Local Memory

REGISTER PQ: It accepts input from output of Adder/Comparator and output to DA if ENPQ is high and to the Adder/Comparator.

REGISTER TM: Either A—Bus or B—Bus can be loaded into TM through mux MXTM. Its content can be output to DA if ENTM is high.

NXC: An increment/decrement counter which is resettable. Its content can get on the A—Bus and output to DA if ENNX is high.

The three registers mentioned above are all 12-bit wide. Together with Register DAO, they form the 15-bit address for local memory.

REGISTER DAO: This is a three-bit register with input signal DAM, which is generated by the state machine. Its output forms the most significant 3-bits of the 15-bit DA.

REGISTER DOU: An 8-bit output register, whose input is formed by the following: Bit 7-6 are always 0. Bits 5-4 are generated from logic. Bits 3-0 come from the most significant 4-bit of the mux MXDO.

REGISTER DOL: An 8-bit output register, whose input comes from the least significant 8 bit of the mux MXDO.

REGISTER DIU: A 4-bit input register which takes input from DD[3:0].

REGISTER DIL: An 8-bit input register which accepts the data from DD[7:0].

REGISTER M: An 1-bit register which latches DD[5] and produces an output MD.

REGISTER F: An 1-bit register which latches DD[4] and produces an output FD.

REGISTER A: An 1-bit register which latches DD[4] and produces an output AD.

INTERNAL REGISTERS

REGISTER OT: It is a temporary register which stores the content from B—Bus and output to B—Bus.

REGISTER TP: It is a temporary register which stores the content from B—Bus and output to B—Bus.

REGISTER MT: It is an 1-bit register which stores the result of comparison from adder/comparator. If it is 1, the input operands of adder/comparator are equal.

REGISTER GR: It is an 1-bit presettable register which will be 0 when COUNTER TC is FFF in hex. The preset value of GR is C/D bit from CREGO.

REGISTER CRI: It accepts the input data from input/output logic and output to B—Bus.

REGISTER CRO: It latches the data from B—Bus before the input/output logic.

REGISTER RM: It is a 24-bit register which stores the information of the number of remaining bytes needed to be processed.

Input/Output Registers to Buffer Memory (610)

REGISTER BAO: It contains the pointers to input buffer and output buffer. The input can come from either IC counter or OC counter. It is enabled by ENBA.

REGISTER BDO: It is an output register which takes input either the data which has been formatted by input/output logic, or the content of status register. It is enabled by ENBD.

REGISTER BDI: It is an input register which latches the input from BD.

REGISTER PAI: It is an input register which latches the three bit address for either the control registers CREG or status registers SREG.

Control Registers

There are eight 8-bit control registers(CREG0–CREG7) addressed by pins PA[2:0]. The definition of the bits in the control registers are as follows:

CREG0:

| 7 | 6 | 5 | 4 | 3 | 2 | 1 | 0 |
|---|---|---|---|---|---|---|---|
| CE | C/D | ICNT_RS | OCNT_RS | DICT_RSEN | FT | ENCRY_EN | KEY |

CE: CHIP ENABLE. When low, all outputs are tri-stated and incoming clock to the data path and state machines of the chip is disabled.

C/D: COMPRESSION/DECOMPRESSION. When high, the chip is in compression mode. When low, the chip is in decompression mode.

ICNT—RS: INPUT COUNTER RESET. When high, lower 4 bits of the input counter are reset. The upper 8 bits will be loaded with the content of CREG5. After reset, ICNT—RS will return to low automatically.

OCNT—RS: OUTPUT COUNTER RESET. When high, the lower 4 bits of the output counter are reset. The upper 8 bits will be loaded with the content of CREG6. After reset, OCNT—RS will return to low automatically.

DICT—RSEN: DICTIONARY RESET ENABLE. During compression, if DICT—RSEN is set, the dictionary will be reset automatically under one of the following conditions:
  i. if compression ratio(ratio between output bytes and input bytes) is greater than 0.5 when input counts reach the end of input buffer or when output buffer is full AND the dictionary is full, or
  ii. if expansion occurs, or
  iii. if EOP is set.

FT: FLOWTHRU. When high, incoming bytes are redirected to output unaltered. Compression and decompression will also be disabled.

ENCRY—EN: ENCRYPTION—EN. When set, processor 604 has the encryption capability. Key words can be loaded via DB[7:0] to CREG7.

KEY: KEY WORD SETUP FOR ENCRYPTION. When high, the 8-byte key-word can be input through PA[2:0]=1 to 7 and BD[7:0].

POWER UP OR HARD RESET CONTENT OF CREG0 : C8(in hex)

CREG1:

| 7 | 6 | 5 | 4 | 3 | 2 | 1 | 0 |
|---|---|---|---|---|---|---|---|
| RSMEM | WAIT_CYCLES1 | | | BLOCK | WAIT_CYCLES2 | | |

RSMEM: RESET MEMORY. When high, it indicates to the chip that resettable RAM is used for the dictionary. In that case, DRS/pin will go low for as many as cycles as specified by WAIT—CYCLES1 to reset the dictionary. If RSMEN is low, 0's are output to DD[7:0] pins with DA[14:0]addressing Bp and Mp portions of the local memory 608 at dictionary reset.

WAIT—CYCLES1: WAIT CYCLES FOR LOCAL MEMORY. These three bits give the number of wait cycles needed to be inserted for memory access of local memory 608. Slower memory can be used with processor 604. 0-7 wait cycles are possible. When RSMEM is set (which means resettable local memory is used), the output pin DRS will be active for as many cycles as specified by WAIT—CYCLES1 bits.

BLOCK: BLOCK ORIENTED DATA

This bit indicates whether the data is block oriented or file oriented. When it is set to low, the data is treated as a file and is continuous from buffer to buffer. As such, there will not be "flush" between input buffers. Flush is only done at the end of output buffers or end of the file.

When it is set, the data is partitioned into blocks with size equal to buffer size. After each input buffer is done, the "flush" code-word is sent to output buffer to signal end of block.

WAIT—CYCLES2: WAIT CYCLES FOR BUFFER MEMORY.

These three bits give the number of wait cycles needed to be inserted for memory access of buffer memory 610. Slower memory can be used with processor 604. 0-7 wait cycles are possible.

POWER UP OR HARD RESET CONTENT OF CREG1: 00(in hex)

CREG2:

| 7 | 6 | 5 | 4 | 3 | 2 | 1 | 0 |
|---|---|---|---|---|---|---|---|
| LOWER BYTE OF PACKET SIZE | | | | | | | |

This gives the least significant 8 bits of the packet size.

POWER UP OR HARD RESET-CONTENT OF CREG2: 00(in hex)

CREG3:

| 7 | 6 | 5 | 4 | 3 | 2 | 1 | 0 |
|---|---|---|---|---|---|---|---|
| MIDDLE BYTE OF PACKET SIZE | | | | | | | |

This gives the middle 8 bits of the packet size. POWER UP OR HARD RESET CONTENT OF CREG3 : 10(in hex)

CREG4:

| 7 | 6 | 5 | 4 | 3 | 2 | 1 | 0 |
|---|---|---|---|---|---|---|---|
| UPPER BYTE OF PACKET SIZE | | | | | | | |

This gives the most significant 8 bits of the packet size.

POWER UP OR HARD RESET CONTENT OF CREG4: 00(in hex)

CREG5: MOST SIGNIFICANT BYTE OF IC. This byte will be loaded into the most significant positions register of IC during IC reset.

POWER UP OR HARD RESET CONTENT OF CREG5: 00(in hex)

CREG6: MOST SIGNIFICANT BYTE OF OC. This byte will be loaded into the most significant positions of register OC during OC reset.

POWER UP OR HARD RESET CONTENT OF CREG6: 00(in hex)

CREG7: It contains the 12-bit starting Tag—word which will be loaded into the Tag Counter at the starting of the compression and decompression operations. Physically CREG7 contains two registers: CREG7A and CREG7B, which are loaded in two consecutive cycles when DATA toggles from low to high and PA[2:0]=7, first CREG7A and then CREG7B.

CREG7A: least significant byte of the starting Tag—word (12 bits in total)
POWER UP OR HARD RESET CONTENT OF CREG7A: 08(in hex)

CREG7B:

| 7 | 6 | 5 | 4 | 3 | 2 | 1 | 0 |
|---|---|---|---|---|---|---|---|
| EOP_RS | J4K | | D_RS | DN_GR | MSNT | | |

EOP_RS: SET END OF PACKET.

When this bit is set, upon receiving STRT, processor will start processing as if End of Packet(EOP) had occurred. This control bit provides the user with capability of direct control over resetting accumulative input and output byte counts, reset dictionary etc. EOP—RS will be reset to 0 automatically.

J4K: JUMP TO 4K BOUNDARY. When this bit is set, AOC (in the case of compression) or AIC(in the case of decompression) will be set to the next 4096 boundary. In addition, in the case of decompression, the upper 12 bits of RM will be decremented by 1. The J4K will be reset to zero automatically.

D—RS: RESET DICTIONARY. When this bit is set, the dictionary memory 608 will be reset after receiving an active STRT. After the dictionary reset, this bit is reset automatically. Note that, if D—RS is set, the dictionary will be reset regardless of whether DICT—RSEN is set or not.

DN—GR: DO NOT GROW DICTIONARY. When this bit is set, no more entry is allowed in the dictionary.

MSNT: MOST SIGNIFICANT NIBBLE OF STARTING TAG—WORD. This nibble, together with the byte in CREG7A, will form the 12-bit starting tag—word.

POWER UP OR HARD RESET CONTENT OF CREG7B: 01(in hex)

Status Registers

In FIG. 7B, there are eight 8-bit Status Registers(-SREG0-SREG7). They can be interrogated by a user through DB[7:0] and the address pins PA[2:0]to find out the status of processor 604. The bits in each of the registers are defined as follows:

| 7 | 6 | 5 | 4 | 3 | 2 | 1 | 0 |
|---|---|---|---|---|---|---|---|
| ERROR | DICT_FULL | EOP | EXPND | FLUSH | IBUF_END | OBUF_FULL | DRSTD |

ERROR: ERROR. When set, it indicated an error has occurred. This error may be due to hardware, unknown codeword, code-size too big or too small etc.

DICT—FULL: DICTIONARY FULL. When set, it indicates the dictionary is full.

EOP: END OF PACKET. If the packet has been read in and compressed or decorepressed, this bit will be set.

EXPND: EXPAND. If the compression ratio, when checked at the the end of input buffer or when output buffer is full, is greater than 1, this bit will be set to indicate expansion of the data.

FLUSH: FLUSHED. When set, the remaining bits at the output have been flushed.

IBUF—END: END OF INPUT BUFFER. When set, it indicates that the data in input buffer has been processed.

OBUF—FULL: OUTPUT BUFFER FULL. When set, output buffer is full.

DRSTD: DICTIONARY RESET: When set, it indicates that the dictionary has been reset.

POWER UP OR HARD RESET CONTENT OF SREG0: 20(in hex)

SREG3, SREG2 & SREG1: contain the most significant, middle, and least significant bytes of the number of input bytes respectively.

SREG6, SREG5 & SREG4: contain the most significant, middle, and least significant bytes of the number of output bytes respectively.

SREG7: TC content(12 bits). Output in two cycles. First byte(contained in SREG7A) has the lower 8 bits of TC. Second byte(in SREG7B) contains the upper 4 bits of TC and O's at the most significant positions.

POWER UP OR HARD RESET CONTENT OF SREG1-SREG6 : 00(in hex)

POWER UP OR HARD RESET CONTENT OF SREG7A: 08(in hex)

POWER UP OR HARD RESET CONTENT OF SREG7B: 01(in hex)

B. COUNTERS

TC: It maps onto SREG7 and is an increment counter which can be loaded with the 12-bit content from CREG7A & B. Its most significant 3-bits will generate the code-sizes for compression and decompression. The output of TC can get on A—Bus.

IC: Input counter which counts the number of incoming bytes of the current operation.

OC: Output counter which counts the number of outgoing bytes of the current operation.

SREG1, SREG2, SREG3: These three status registers form the 24-bit increment counter which is resettable. It contain the up-to-date number of input bytes processed thus far accumulatively.

SREG4, SREG5, SREG6: These three status registers form the 24-bit increment counter which is resettable. It contain the up-to-date number of output bytes processed thus far accumulatively.

Special Code-Word Rom

It stores eight reserved codewords with the values:
256—dictionary reset
257—flush
258—
259—
260
261
262
263

Adder/Comparator

There is an adder to calculate the hashing address for local memory 608. In addition, a comparator is available to find any match of two operands.

Input/Output Logic 700

Compression

When compression first starts, the special code word 256 will be sent out to indicate that the dictionary has been reset. Thereafter, characters are read into the chip and the corresponding code words are sent out. As the length of code words varies form 9 to 12 bits, and data is sent out one byte at a time, reformatting needs to be done, and this is the function of the input/output logic 700.

The input/output logic 700 includes barrel shifters, adders and control logic. Also there is a register which stores the residue bits which are the bits left over from last output and which are not enough to make up one byte. These bits are to be concatenated with the next outgoing code word to form a new byte. The data is then sent out one byte at a time until not more than one byte residue is left.

Decompression

In the decompression operation, the present invention, in a way, is reversing the compression operation. The code words are read in, one byte at a time. As the length of code-words can be anywhere between 9 to 12 bits, more than one byte is needed to form the initial code word. Bytes are input to form the codeword. After this code word has been processed, the bits left in the input/outputlogic are then concatenated with the next incoming byte(s) to form new code words.

Encryption

Encryption is also performed in the input/output logic 700. For compression, before the code word is sent out, it is encrypted by performing a modulo function. Then it is formatted. For decompression, when the bytes are input, they are formatted to form the code words. Then the code words are decrypted before they are sent to the decompression engine.

Operation Flows

Processor 604 will respond differently to different conditions, how the Control Registers are set, and whether it is performing compression or decompression.

Figure 8:
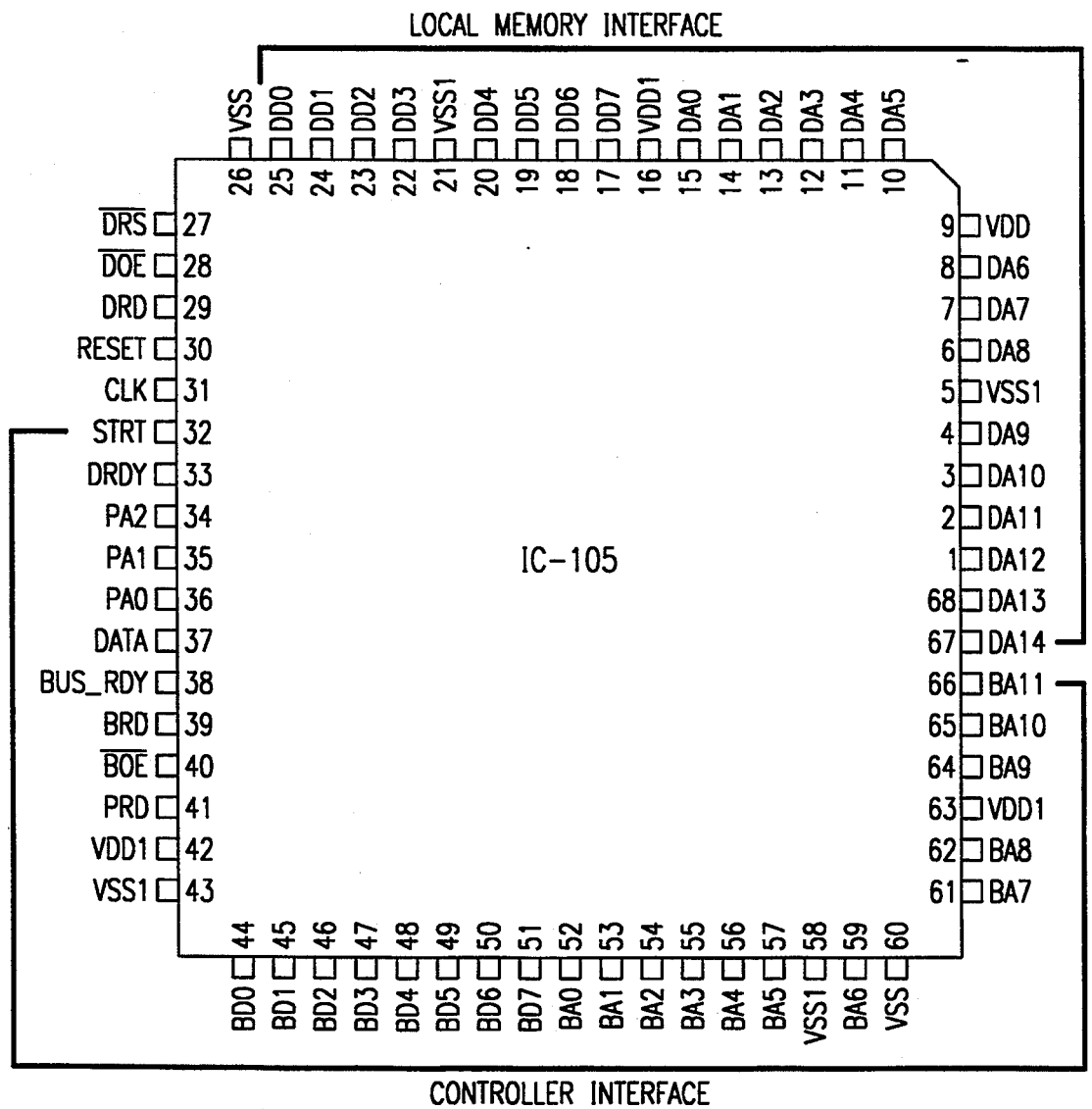
FIG. 8 depicts a pinout configuration of a single chip according to the present invention.

A pin-out description and configuration will now be described in conjunction with FIG. 8.

Interface to Disk Controller and Memory Buffer

BA[11:0]: BUFFER ADDRESS. OUTPUT

A 12-bit address to the input buffer and output buffer.
BD[7:0]: BUFFER DATA. BIDIRECTIONAL These pins are attached to the bus shared by the buffer memory and other processors. Both data, commands and status are transferred through BD[7:0]
PA[2;0]: PROCESSOR ADDRESS. INPUT Incoming address for control registers CREGs and status registers SREGs. The address shares the same memory map as the disk controller.
DRDY: DATA READY. OUTPUT An output signal, when high, indicates to external controller that one of the following conditions has occurred:
 a. end of packet.
 b. end of input buffer.
 c. output buffer full.
 d. error.

Upon receiving this signal, external controller can interrogate the SREG0 to find out what has happened and take appropriate action.
BRD: BUFFER READ. OUTPUT When high, processor will read data from buffer memory from controller. When low, data will be written out from processor.
BOE : BUFFER OUTPUT ENABLE. OUTPUT When low, it enables the output of buffer memory.
ATA: DATA or COMMAND or STATUS. INPUT When high, it indicates data are being transferred. When low, status will be read out or commands will be written into IC001.
STRT: START. INPUT A signal from external controller to inform processor 604 that it has accomplished the task(such as finish writing the input buffer or output buffer has been read out). Upon receiving this signal, processor 604 will take appropriate action depending on the current status of processor 604. In general, processor 604 will start the compression or decompression operation.

STRT should go active only for one cycle and should not go active again before processor 604 issues DRDY.
PRD: PROCESSOR READ. INPUT A signal from external controller to indicate to processor 604 the direction of data at BD[7:0]. PRD has no effect when DATA pin is high. However, when DATA is low, commands will be written to CREGs through BD[7:0] if PRD is low, or status will be read from SREGs through BD[7:0] when PRD is high.
BUS—RDY: BUS READY. INPUT This signal indicates to processor 604 that in the next cycle the bus is available for BD[7:0] to transfer data/status/commands. As the bus is shared by several resources, a time slot of n clock cycles is reserved for processor 604 to transfer data. BUS—RDY should go high for (n−WAIT—CYCLES2) cycles at the beginning of this time slot, and remain low for rest of the cycles. If there is a dedicated bus for processor 604, this pin should tie high.

B. INTERFACE TO LOCAL MEMORY

DA[14:0]: DICTIONARY ADDRESS. OUTPUT

Address output to local memory of processor.
DD[7:0]: DATA FOR LOCAL MEMORY. BIDIRECTIONAL Data port between Local Memory and processor.
DRS : DICTIONARY RESET. OUTPUT This pin is active low. If resettable memory is used, this pin will be low for number of cycles as specified by WAIT—CYCLES1 to initialize the dictionary. It should be left unconnected if regular memory is used.
DOE : DICTIONARY OUTPUT ENABLE. OUTPUT An output enable signal for local memory. It is low active.
DRD: DICTIONARY READ. OUTPUT When high, processor 604 will read data from local memory 608. When low, data will be written into local memory 608.

Miscellaneous

RESET: RESET. INPUT

A hard reset signal to bring processor 608 to the initial state. To properly reset processor 604, the RESET signal, once activated, should not be deactivated until the CLK is running.
CLK: CLOCK. INPUT The master clock input for processor 604.
VSS1: GROUND.
VSS: GROUND FOR INTERNAL CIRCUITRY.
VDD1:+5 V
VDD: +5 V FOR INTERNAL CIRCUITRY.

Timing

The timings are specified for TA(ambient temperature)=0 C. to +70 C.

VDD=+4.75 V to +5.25 V

| PARAMETERS | MIN | TYP. | MAX | UNITS |
|---|---|---|---|---|
| Tcy: CLOCK CYCLE TIME | 25 | | 1000 | ns |
| Tch: CLOCK HIGH TIME | 10 | | 900 | ns |
| Tcl: CLOCK LOW TIME | 10 | | 900 | ns |
| INPUT and OUTPUT Timing: | | | | |
| INPUT TIMING: | | | | |
| Ts: INPUT SETUP TIME | 10 | | | ns |
| Th: INPUT HOLD TIME | | | 0 | ns |
| OUTPUT TIMING: (CL = 60 pF with TTL loads) | | | | |
| Td: OUTPUT DELAY | | | 25 | ns |
| Toh: OUTPUT HOLD TIME | 5 | | | ns |

B. Timing for programming the Control Registers(-CREGs)
    a. Timing for writing CREG0-6
    b. Timing for writing CREG7
C. Timing for reading the Status Registers(SREGs)
    a. Timing for reading SREG0-6
    b. Timing for reading SREG7
D. Timing for accessing Buffer Memory
    a. Reading from Buffer Memory
    b. Writing to Buffer Memory
E. Timing for accessing Local Memory
    a. Reading from Local Memory
    b. Writing to Local Memory
E. Timing for STRT and DRDY
F. Timing for RESET
G. Timing for STRT and DRDY The software control aspects of the present invention will now be described.

Figure 9:
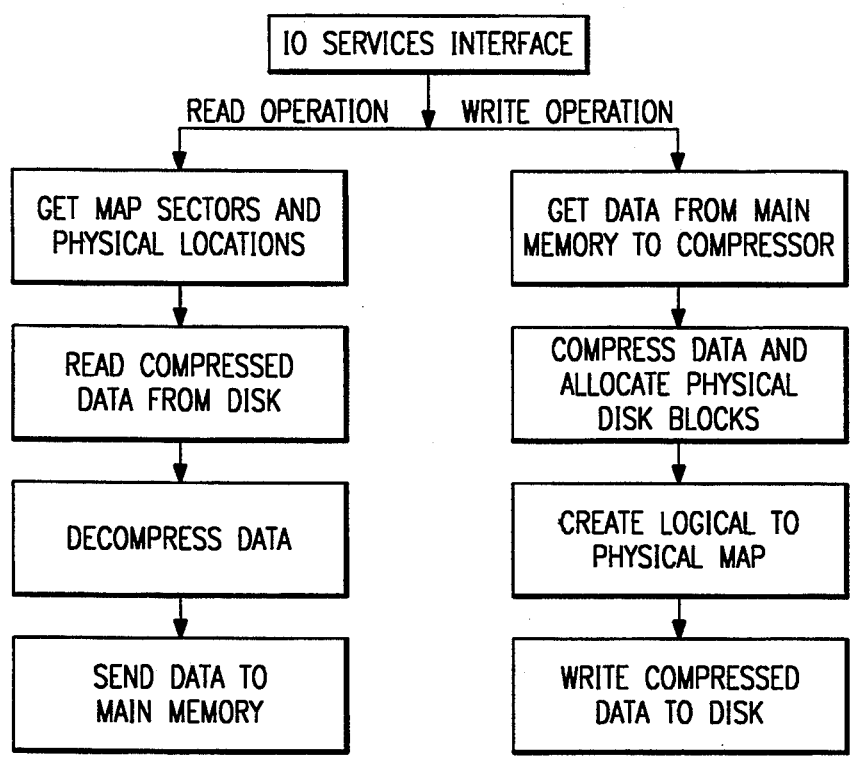
FIG. 9 depicts a diagram of a disk device driver architecture.

FIG. 9 discloses the general architecture of how compression is incorporated into a disk drive architecture. The disk operations of interest are read and write operations. For a write operation, data is retrieved from the system and compressed, then reallocated on the physical disk, and the tables are updated.

For a read operation, the physical location of the sectors or blocks of interest are determined, read from the disk and then decompressed. Then the data can be read from memory. One aspect is to keep all of the data on the disk in compressed form and all the data in memory or outside the disk system in uncompressed form, as shown in FIG. 9.

Some applications such as fast backup and communications may choose to read compressed data directly from the disk to speed up the operation. Such operations would normally require data movement, and will rely on the target device to perform the decompression if needed.

Figure 10:
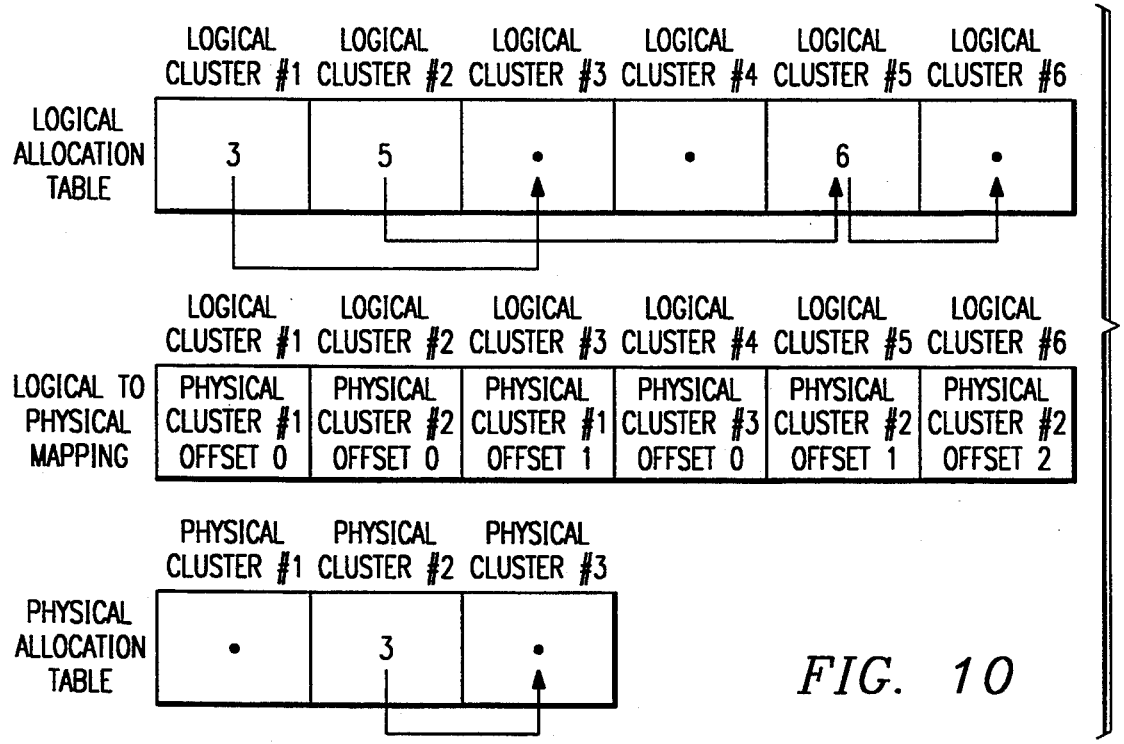
FIG. 10 depicts a diagram of a file system mapping according to the present invention.

FIG. 10 discloses the general architecture of the file system mapping that happens when introducing compression in the disk subsystem. An operating system expects a consistent view of what the disk size and parameters are, and it always expects fixed size blocks. Data is presented to the disk in the operating system in the same form it is used except that a bigger disk is presented. The amount of table space presented to the system will support a larger size disk to enable the operating system to access a larger disk. The present invention can transparently introduce compression into a system without having to change the operating system itself.

On the physical side, the disk is also arranged in fixed blocks, because most disk controllers organize disks in fixed size blocks. In order to perform logical block read/write, a logical to physical mapping layer is introduced between the virtual or logical layer and the physical layer, which maps every logical sector into its physical sector/byte offset physical location. For example, logical cluster No. 1 will map into physical cluster No. 1 at offset zero, and so on, as seen in FIG. 10.

In the logical allocation table of FIG. 10, there is a series of forward link lists. For example, logical cluster No. 1 points to logical cluster No. 3, and logical cluster No. 3 has a null pointer, which indicates the end of file. So file No. 1 is represented by two logical clusters, No. 1 and No. 3.

File No. 2 is represented by three logical clusters. Logical cluster No. 2, which points to logical cluster No. 5, which points to cluster 6, which is the last cluster in the logical chain representing the file. As seen with FIG. 10, logical cluster No. 4 is a file by itself. It is a small file that fits in one block. The same structure applies in the physical allocation table, except that the links become smaller, because of the smaller size.

If the operating system requests a read on logical cluster No. 5, logical cluster No. 5 will map into physical cluster No. 2 at offset 1. The offset is a function of the smallest allocation unit possible on the physical disk. The smaller the allocation unit is, the smaller the amount of unutilized physical space. However, the table area will occupy a larger area on the disk with smaller allocation unit.

The read request to a logical cluster will get mapped into the corresponding physical location, which then passes the compressed data to the decompression process, and the requested data is passed to the operating system. A write request is processed in a similar manner.

This architecture applies in the case where every single cluster is compressed by itself, as an individual entity. For example, if logical cluster No. 5 is requested, the system finds the physical sector and the offset where the compressed data resides, obtains the data and decompresses it, based on the fact that compression was started at the beginning of that cluster.

This approach does not achieve high compression ratio due to the restart of the dictionary with each block to be compressed. Multiple blocks need to be compressed together to increase the compression efficiency in order to allow enough input data to be processed by the compression engine.

Figure 11:
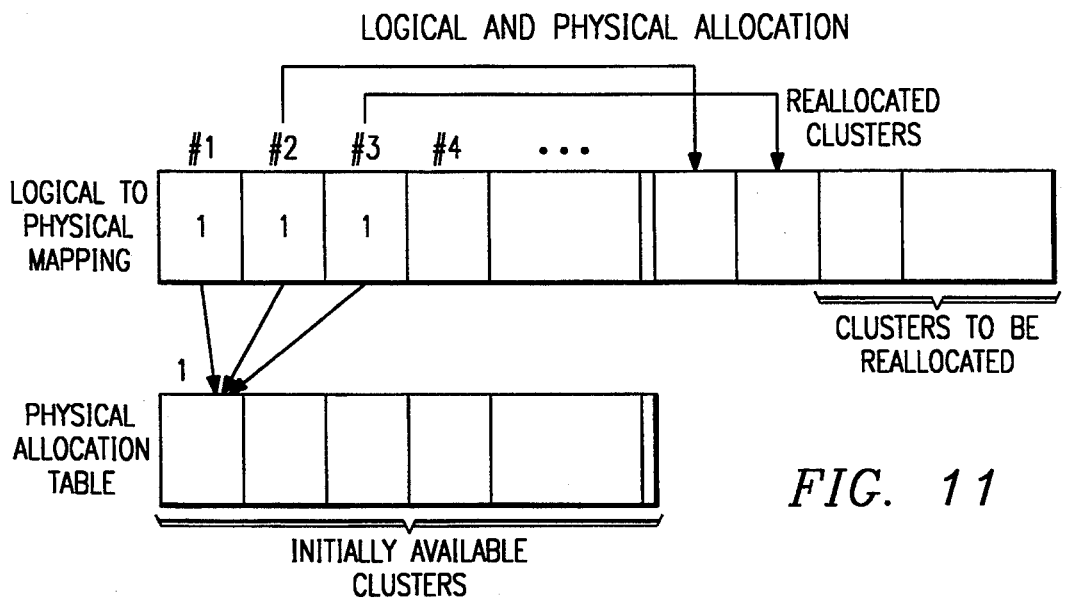
FIG. 11 depictes logical and physical allocation according to the present invention.

FIG. 11 discloses how the logical and the physical allocation strategies interact. The operating system has to know how much disk space is available to be allocated. FIG. 10 assumes fixed compression which, for example, 2:1 compression ratio can increase the disk size up to double the physical disk size.

Since different types of data achieve different compression efficiency, the system has to adjust the amount of available space to the operating system according to how much compression ratio was achieved. For example, if a disk was formatted to double its physical capacity, and that a data file achieved a 3/2:1 compression ratio. When the physical disk is all occupied, the driver has to convince the operating system that the logical space is also all occupied. The solution is to make the amount of available space to the operating system always equal to the amount of available physical space. The rest of the logical or virtual disk will not be available to the operating system. For example, the driver can keep that reserved space in a file imaged by the driver itself.

When the system writes one file which, for example, is represented by logical clusters No. 1, 2 and 3, it compresses that file (assuming there is 3 to 1 compression on that file. In order to maintain the balance between the logical and the physical space, the driver will free two blocks from the reserved area and update the size of the file imaging the logical disk space.

The total amount of data than can be stored on a particular disk is thus dependent on the overall compression ratio achieved and the size of the logical disk. The size of the logical disk is defined by the estimated compression ration used to format the disk. The difference between the logical size and the physical size of a file will be reallocated from the hidden area in the logical disk, which are shown as reallocated clusters in FIG. 11.

If the same file was deleted, then the system deallocates one block from the physical disk while having to release three blocks from the logical disk, which implies that the two blocks (the reallocated clusters) will be added to the reserved cluster pool (because the file had a 3 to 1 compression ratio).

The system keeps freeing disk blocks to the operating system or taking them away when copying and deleting files, to keep the balance of the available logical space equal to the physical available space.

Figure 12A:
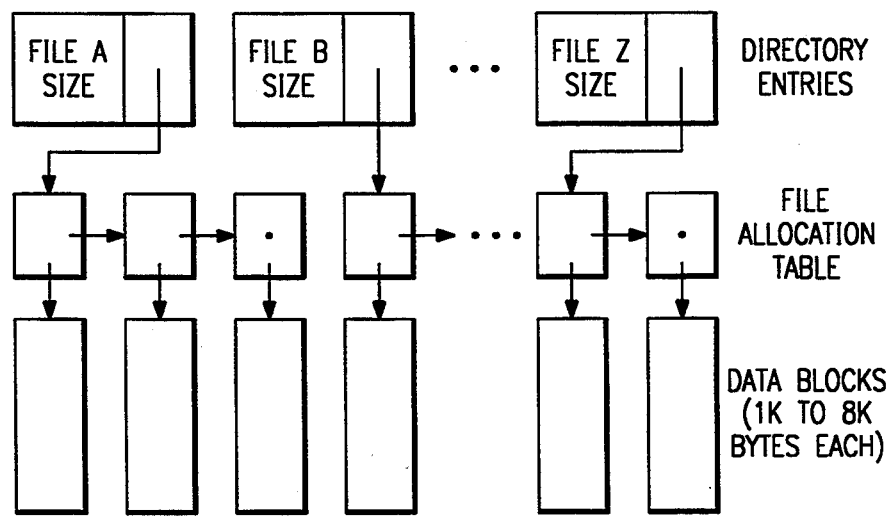
FIGS. 12A and 12B depict file allocation strategies without compression and with compression, respectively.

The allocation strategy when compression is employed in a file system will now be discussed. FIG. 12A discloses a representation of a file system that does not have compression. The top row of blocks in FIG. 12A are referred to as directory entries, and have information regarding all of the files on the disk, such as the file name (for example, A, B up to Z), the size of each file, and a pointer to the starting block of each file on a disk.

Figure 12B:
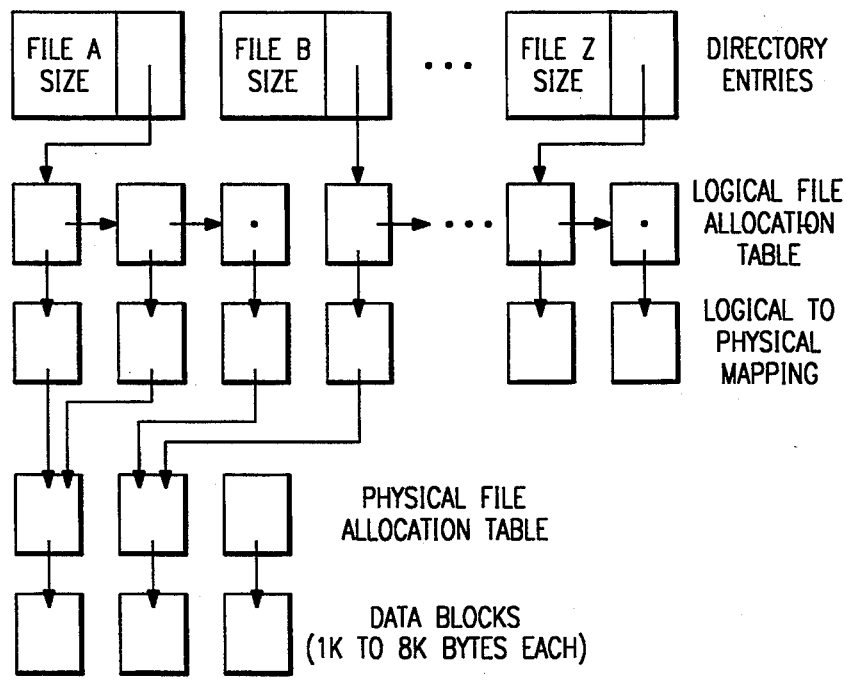

The second row of blocks in FIG. 12A referred to as the file allocation table consists of linked lists of pointers that point to where the data is on the disk. Each one of the file allocation table entries points to a data block, which is normally between 512 to 8096 bytes, depending on the system implementation. In order to implement compression in a file system as depicted in FIG. 12B, the system keeps the structure of the directory entries the same as without compression, retaining the same file sizes so that the operating system is presented with the same file sizes, and becomes unaware of the existence of compression.

The original file allocation table in FIG. 12A is represented by the logical file allocation table. It exactly conforms to the structure that the operating system is used to, except that it has more entries because of the expanded disk size.

To actually write data on the blocks in the physical disk, the system includes a physical file allocation table which has pointers to the physical locations where the data resides. The key component of the system is the middle row of FIG. 12B, which is the mapping between the logical and the physical allocation tables, as discussed above. The map table takes each file allocation table entry which points to the data address on the logical disk and maps it into the data address on the physical disk. That way, the system will be able to decompress the data corresponding to each logical block.

As also discussed above, all of the above architecture can be implemented if each cluster or block is compressed separately (which may sacrifice the compression ratio).

Figure 13A:
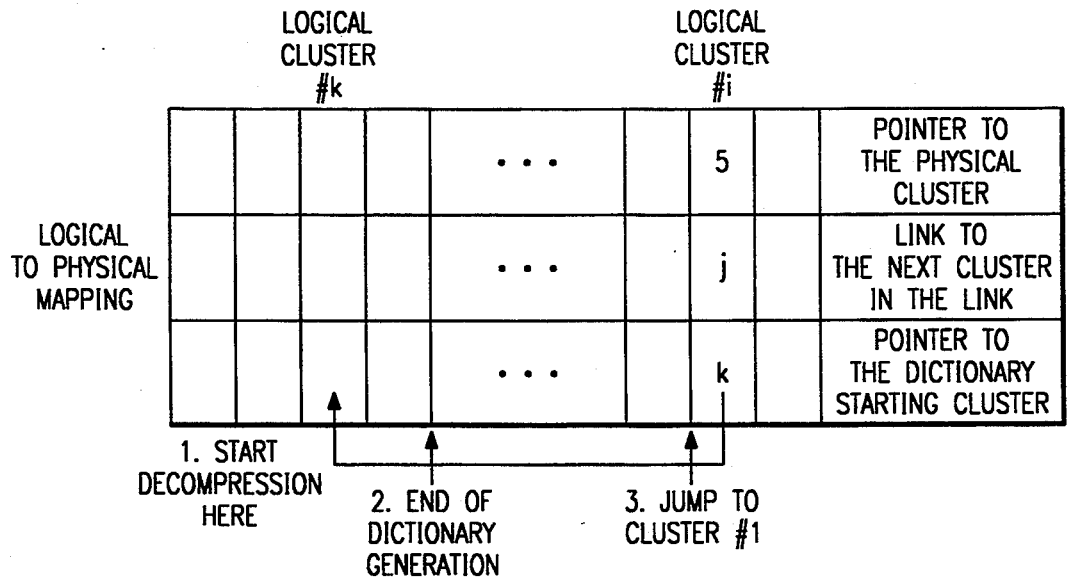
FIG. 13A depicts cluster random access.
Figure 13B:
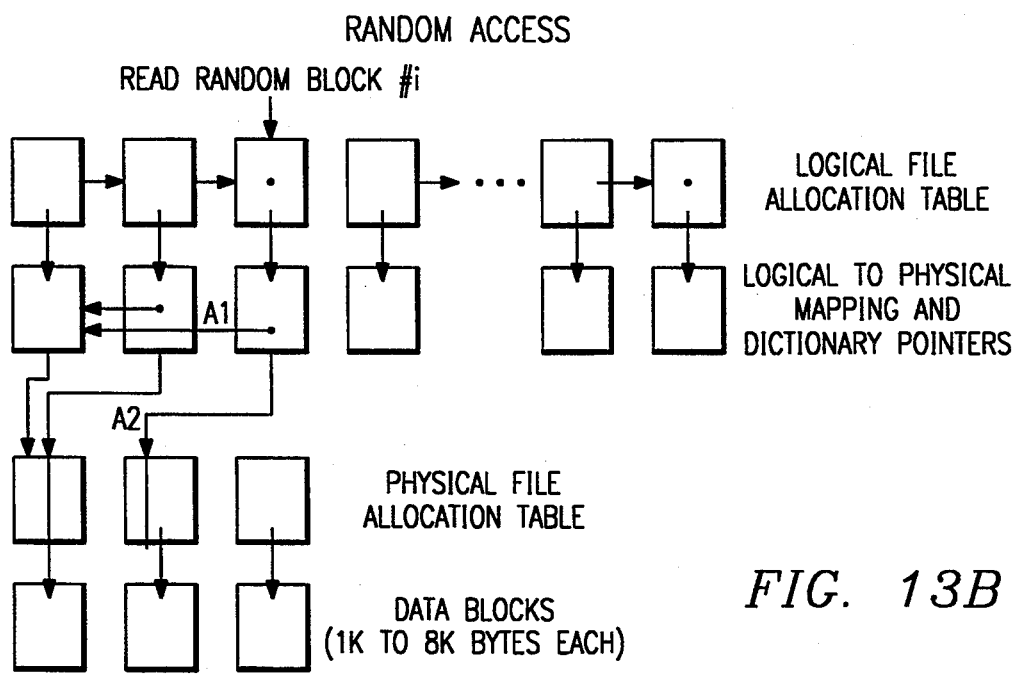
FIG. 13B depicts a diagram of random access according to the present invention.

FIGS. 13A and 13B disclose an implementation that will achieve a higher compression ratio without the requirement that the system has to reset the dictionary or restart compression at the beginning of a block.

FIG. 13A discloses a logical to physical mapping architecture that achieves random access ability to the data without sacrificing compression ratio. There are three entries in the map for each logical cluster. For example, logical cluster No. 1 maps into physical cluster No. 5, which is achieved by the first field in that entry. The second field is linked to the next cluster which is, for example, cluster J. The third field points to which cluster can be used to generate the dictionary that generated this particular block, which is referred to as cluster No. K in FIG. 13A.

In step No. 1 of FIG. 13A, decompression starts at cluster No. K, which is the cluster that the system had as a pointer to the beginning of a dictionary.

Decompression continues with step No. 2, which detects the end of the dictionary. Once the system has detected that the dictionary is full, then it can jump to the exact physical location of cluster No. 1 and start decompression, so that the system does not have to restart the dictionary at every cluster boundary.

At the same time, the system does not have to decompress a large file before it gets to cluster No. 1.

FIG. 13B discloses how to implement this mechanism inside a file allocation table architecture. If there is a request for a random block read (the top of FIG. 13B), the system follows the logical to physical mapping and retrieves the compressed data that generates the dictionary. So, the first step is to follow the pointer A1 which determines the location where decompression starts. Decompression continues until the dictionary is filled up.

The second step is to jump to boundary A2 in the physical file allocation table of FIG. 13B and start decompressing from that location. After decompression is done, the system will be able to retrieve block No. 1 in a random access fashion. The needed overhead is to decompress the initial portion at the beginning of each chain or file, up to the point where the dictionary is completely built.

The system can achieve this random accessibility by introducing the flush codes described in more detail in the above identified cross-referenced application. At the end of every compressed block, the system sends the flush codes which isolate the compressed images of each individual block, and insures when the system can start decompression at point A2 in FIG. 13B.

In FIG. 13B, the pointers to the boundary A2 are determined by introducing a flush code while the compression process takes place, to make sure that that point will generate legitimate decompressed data. The physical file allocation table will point to the exact location of the physical data block which the system will be able to retrieve, decompress, and then the operating system will get the data block that it expects.

Figure 14:
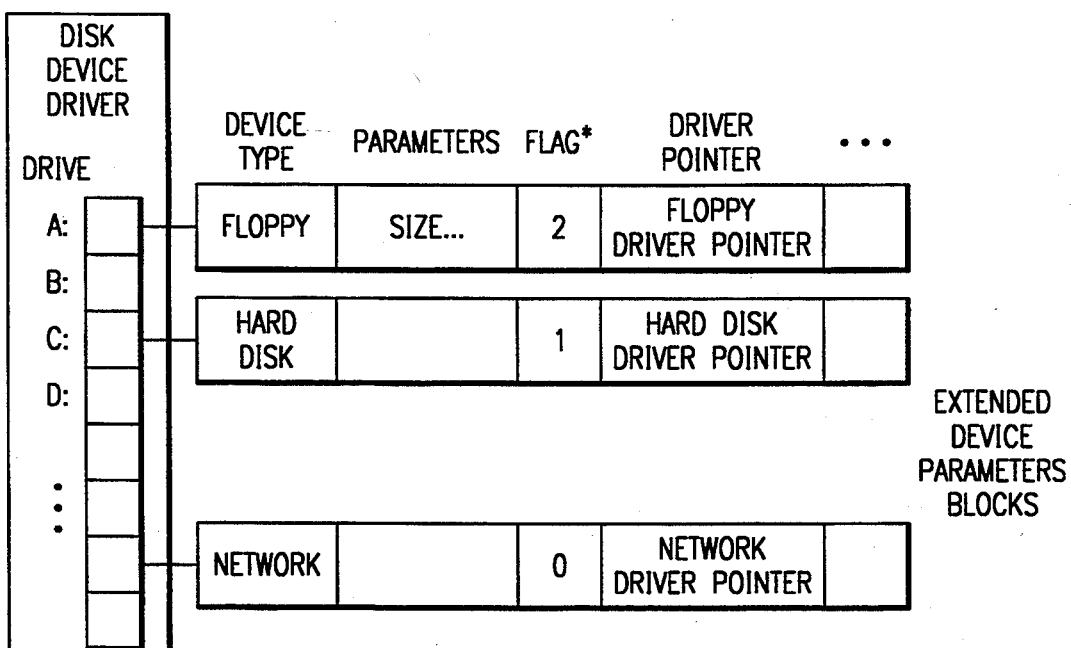
FIGS. 14 and 15 depict diagrams of software architecture according to the present invention.

FIG. 14 is an example of software architecture according to the present invention that can be used in the system to handle compressed and uncompressed disks at the same time. In the disk device driver, there will be an entry for every hard disk drive, floppy disk, or any block device where compression can be supported. Each device will be referred to by a letter A:, B:, C:, D:, and so on. Each one of these entries points to a structure that gives the driver the information it needs about the device.

For example, in FIG. 14, the drive designated by the letter A is a floppy drive. It has a maximum size determined by the first field, and and there is a flag field that determines the applicability of compression on the device. When the flag value is equal to 2, the system will check each individual floppy disk to determine whether or not the disk is compressed.

The third field contains a pointer to the location of the software driver residing in memory, so the system will be able to go to the correct device interface.

Drive No. C, for example, is a hard disk which also has a maximum size field. The value of the flag field determines whether a hard disk is compressed (if the flag equals 1). Also, a hard disk entry includes a pointer to where the disk driver exists in memory. Thus, the system can always identify devices as compressed or not compressed. For example, it can have a network device that does not support compression with the flag field being zero. The driver will pass the data to the networking driver without altering.

Figure 15:
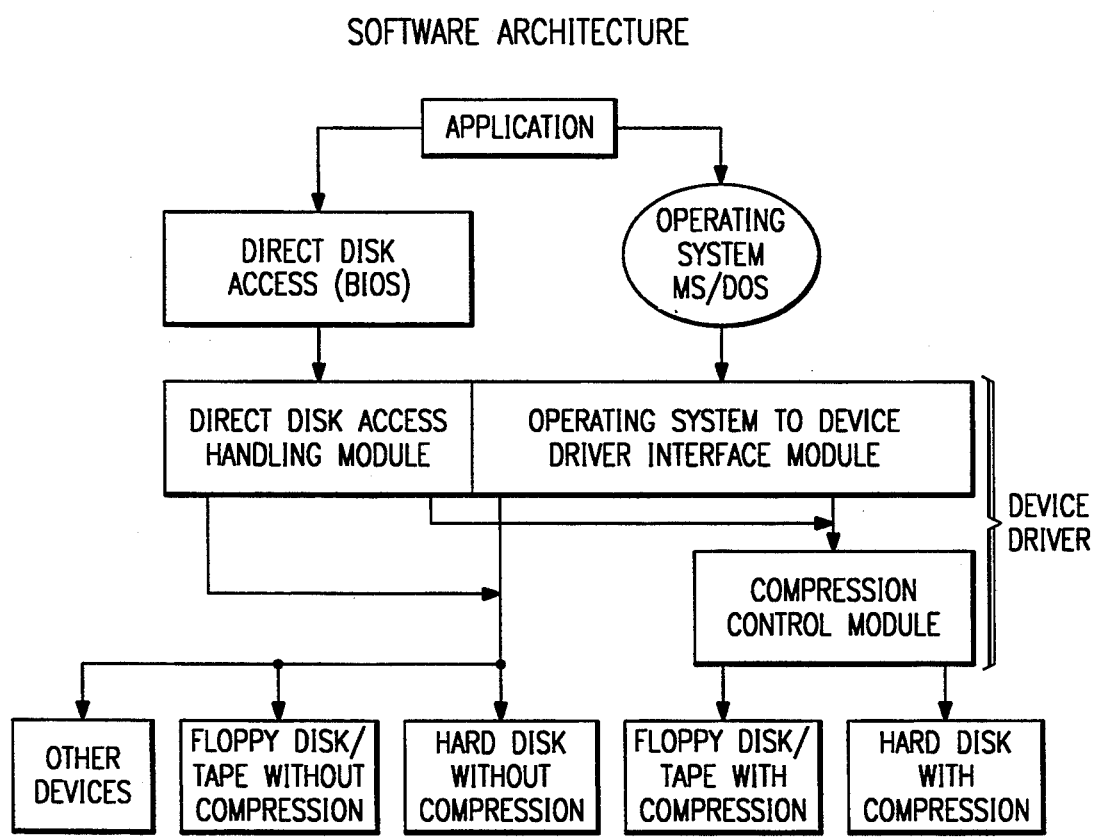

FIG. 15 discloses more information about the software architecture. The compression control module in FIG. 15 is the key component. The control module is an interface between the physical medium and the operating system if compression is employed in the file system.

Following the path of an application in FIG. 15, the application will read or write data using an operating system. The operating system will call the device driver responsible for the drive where the data is to be written.

The device driver architecture which was introduced in FIG. 14 consists of three modules. The top level module is the device driver interface module. The monitor level that was discussed in FIG. 14 is the module that determines which drive supports compression and which drive does not support compression. If the drive does support compression, the compression control module will be called and the compression control module will turn the compression on for a hard disk or a floppy.

The operating has to handle the end of disk conditions if the disk is compressed. Since the compression ratio is variable, the system cannot estimate the exact logical size of a disk with a specified physical size. The system can handle this condition by managing the amount of available free space as discussed in FIG. 11.

If the drive does not support compression, then the raw data will be read or written.

Some operating systems like MS-DOS have direct access paths to a disk through a BIOS. For such application, the system should have a Direct Disk Access Handling Module which will also turn on and off compression by calling the compression control module. If appropriate, it will pass the data through if the device does not support compression, as shown in FIG. 15.

The foregoing description of the preferred embodiment of the invention has been presented for purposes of illustration and description. It is not intended to be exhaustive or to limit the invention to the precise form disclosed, and many modifications and variations are possible in light of the above teaching. The preferred embodiment was chosen and described in order to best explain the principles of the invention and its practical applications to thereby enable others skilled in the art to best utilize the invention and its various embodiments and with various modifications as are suited to the particular use contemplated. It is intended that the scope of the invention be defined only by the claims appended hereto.

What is claimed is:

1. A method of accessing files of compressed data on a mass storage device comprising the steps of:
   allocating one or more logical data blocks to each file using a first allocation table;
   allocating one or more physical data blocks for storing file data using a second file allocation table; and
   translating between said first file allocation table and said second file allocation table in response to a request to access the storage device.

2. The method of claim 1 wherein said translating step comprises the step of translating between said first file allocation table and said second file allocation table using a mapping table.

3. The method of claim 2 wherein said first file allocation table comprises a plurality of entries, each entry associated with a respective logical data block.

4. The method of claim 3 wherein said step of allocating one or more logical data blocks comprises the step of associating each file with one of said entries corresponding a first logical data block associated with that file and creating a linked list of entries in said first allocation file indicating the logical data blocks associated with the file.

5. The method of claim 4 wherein each entry of the first allocation table is associated with a respective entry in the mapping table which indicates a physical data block allocated by said second allocation table.

6. A system of storing and retrieving compressed data comprising:
   a first file allocation table for allocating one or more logical data blocks to each of a plurality of files;
   a second allocation file for allocating physical data blocks for storing file data; and
   a mapping table for translating between said first and second file allocation tables in response to a request to access the storage device.

7. The system of claim 6 and further comprising a processor for compressing the file data in response to a write operation to the storage device and decompressing the data responsive to a read operation from the storage device.

8. The system of claim 7 wherein said first file allocation table comprises a plurality of entries, each entry associated with a respective logical data block.

9. The system of claim 8 wherein said mapping table comprises a plurality of entries corresponding to respective of said first file allocation table entries, each entry of said mapping table indicating a physical data block allocated by said second allocation table.

10. The system of claim 6 wherein said first allocation table maintains a linked list of logical data blocks for each file.

11. A method of accessing files of compressed data on a mass storage device comprising the steps of:
    maintaining a first file allocation table which indicates one or more logical data blocks;
    maintaining a second file allocation table which indicates one or more physical data blocks on the mass storage device where the compressed data associated with each file is stored;
    mapping between the first file allocation table and the second file allocation table in response to a request to access the mass storage device.

12. The method of claim 11 wherein each block of said second file allocation table comprises a plurality of allocation units, and said mapping step comprises the step of associating each block of said first file allocation table with one or more of said allocation units.

13. The method of claim 11 wherein said mapping step comprises the step of associating each block of said first file allocation table with a block of said second file allocation table and an offset into said block of said second file allocation table.

14. The method of claim 11 and further comprising the step of allocating a number of logical data blocks in excess of the number of physical data blocks to said first allocation table.

15. The method of claim 11 wherein said mapping step comprises the step of mapping a plurality of logical data blocks into a single physical data block.

16. The method of claim 11 wherein said mapping step comprises the step of mapping each logical data block to a physical block and an offset into the physical block.

* * * * *